(12) United States Patent
Fuji

(10) Patent No.: US 11,515,223 B2
(45) Date of Patent: Nov. 29, 2022

(54) PACKAGE STRUCTURE, SEMICONDUCTOR DEVICE, AND FORMATION METHOD FOR PACKAGE STRUCTURE

(71) Applicant: ROHM CO., LTD., Kyoto (JP)

(72) Inventor: Kazunori Fuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/268,018

(22) PCT Filed: Aug. 23, 2019

(86) PCT No.: PCT/JP2019/033015
§ 371 (c)(1),
(2) Date: Feb. 11, 2021

(87) PCT Pub. No.: WO2020/045274
PCT Pub. Date: Mar. 5, 2020

(65) Prior Publication Data
US 2021/0166985 A1  Jun. 3, 2021

(30) Foreign Application Priority Data

Aug. 29, 2018 (JP) .............................. JP2018-160370

(51) Int. Cl.
*H01L 23/495* (2006.01)
*H01L 23/31* (2006.01)
*H01L 23/00* (2006.01)

(52) U.S. Cl.
CPC .... *H01L 23/3107* (2013.01); *H01L 23/49582* (2013.01); *H01L 23/562* (2013.01)

(58) Field of Classification Search
CPC .......... H01L 23/3107; H01L 23/49582; H01L 23/562; H01L 23/3142; H01L 23/492;
(Continued)

(56) References Cited

U.S. PATENT DOCUMENTS

2018/0278172 A1* 9/2018 Tokuyama .......... H01L 23/3675

FOREIGN PATENT DOCUMENTS

JP   2006-310609 A   11/2006
JP   2013-71312 A    4/2013
(Continued)

OTHER PUBLICATIONS

International Search Report issued in PCT/JP2019/033015, dated Nov. 19, 2019 (2 pages).

*Primary Examiner* — Kimberly N Rizkallah
*Assistant Examiner* — Dilinh P Nguyen
(74) *Attorney, Agent, or Firm* — Hamre, Schumann, Mueller & Larson, P.C.

(57) ABSTRACT

A package structure includes a metal member and a resin member. The metal member has an obverse surface facing one side in a first direction. The resin member is disposed in contact with at least a portion of the obverse surface. The obverse surface has a roughened area. The roughened area includes a plurality of first trenches recessed from the obverse surface, each of the first trenches having a surface with a greater roughness than the obverse surface. The plurality of first trenches extend in a second direction perpendicular to the first direction and are next to each other in a third direction perpendicular to the first direction and the second direction. The plurality of first trenches are filled up with the resin member.

20 Claims, 26 Drawing Sheets

(58) Field of Classification Search
CPC ......... H01L 23/49541; H01L 23/49548; H01L 23/49562; H01L 23/49575; H01L 23/4334; H01L 2224/0603; H01L 2224/40; H01L 2224/48091; H01L 2224/4846; H01L 2224/48472; H01L 2224/4903; H01L 2224/73265; H01L 2924/181; H01L 2924/19107; H01L 23/50
USPC ....................................................... 257/666
See application file for complete search history.

(56) References Cited

FOREIGN PATENT DOCUMENTS

| | | | |
|---|---|---|---|
| JP | 2014-166693 A | | 9/2014 |
| JP | WO 2017/056686 | * | 4/2017 |
| JP | 2018-67600 A | | 4/2018 |
| WO | 2016-117711 A1 | | 7/2016 |

* cited by examiner

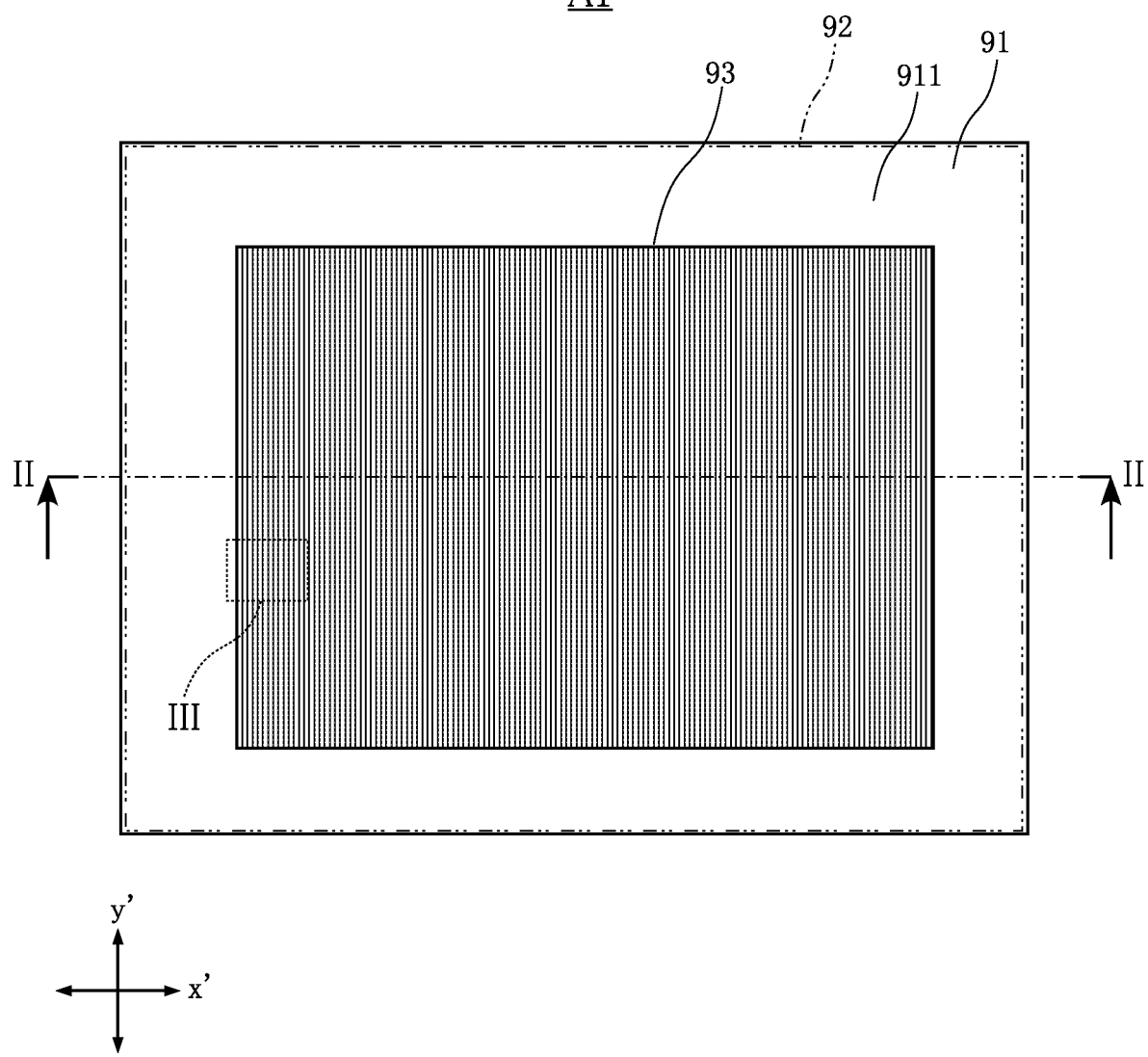

FIG.2    A1
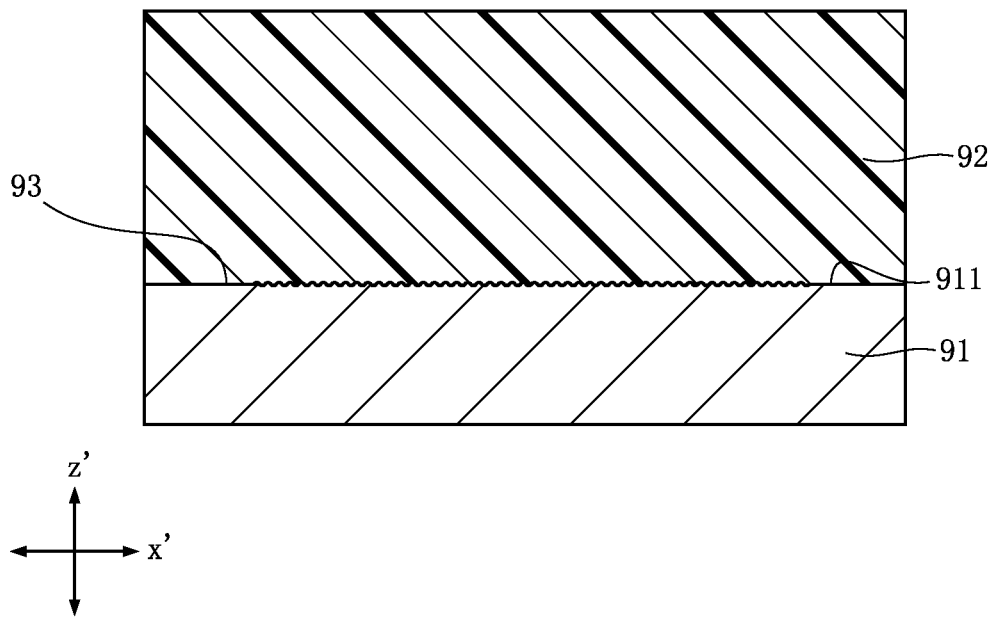
FIG.3    A1
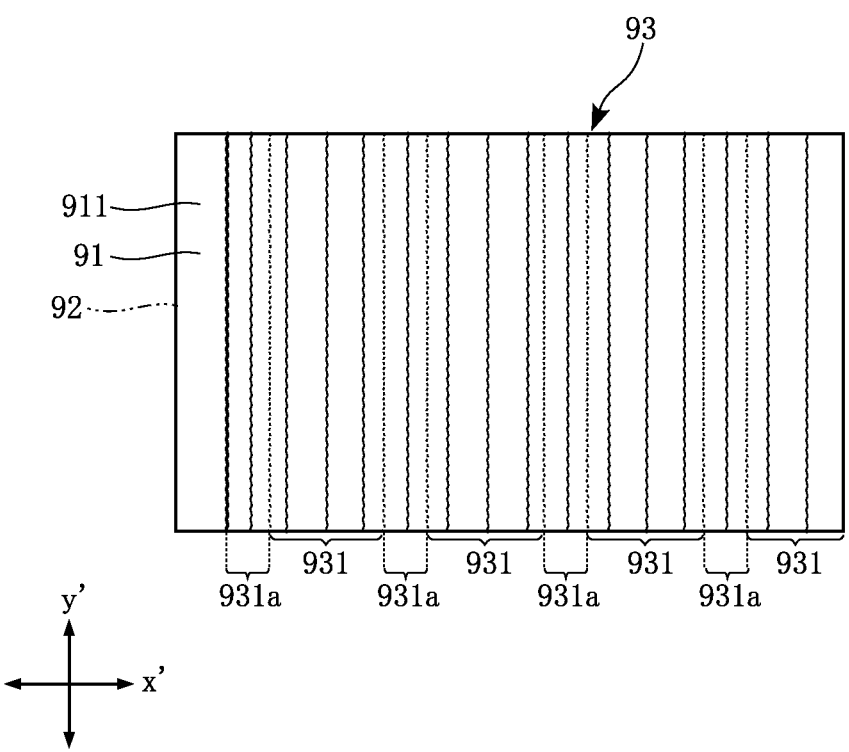

FIG.12
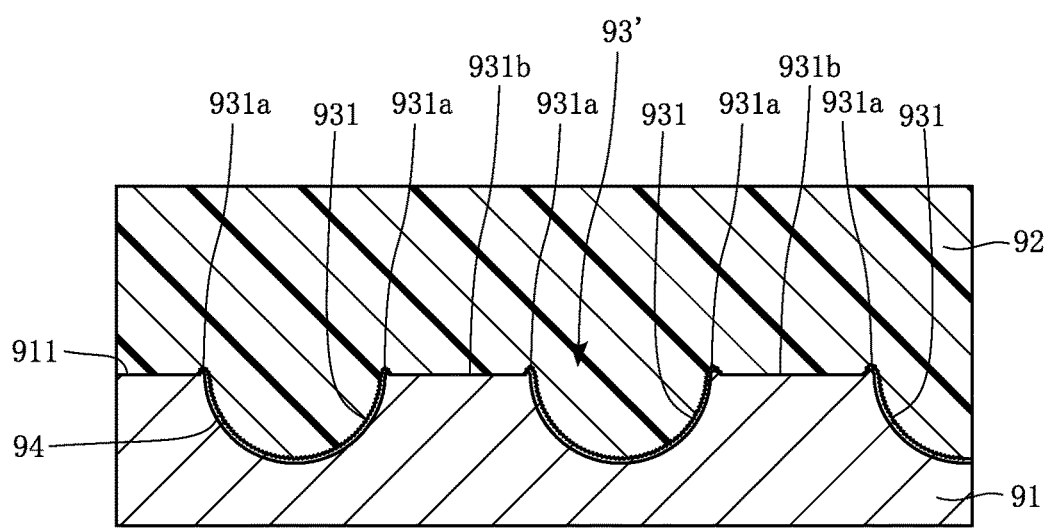
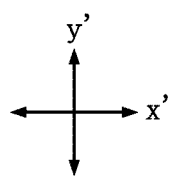

FIG.13
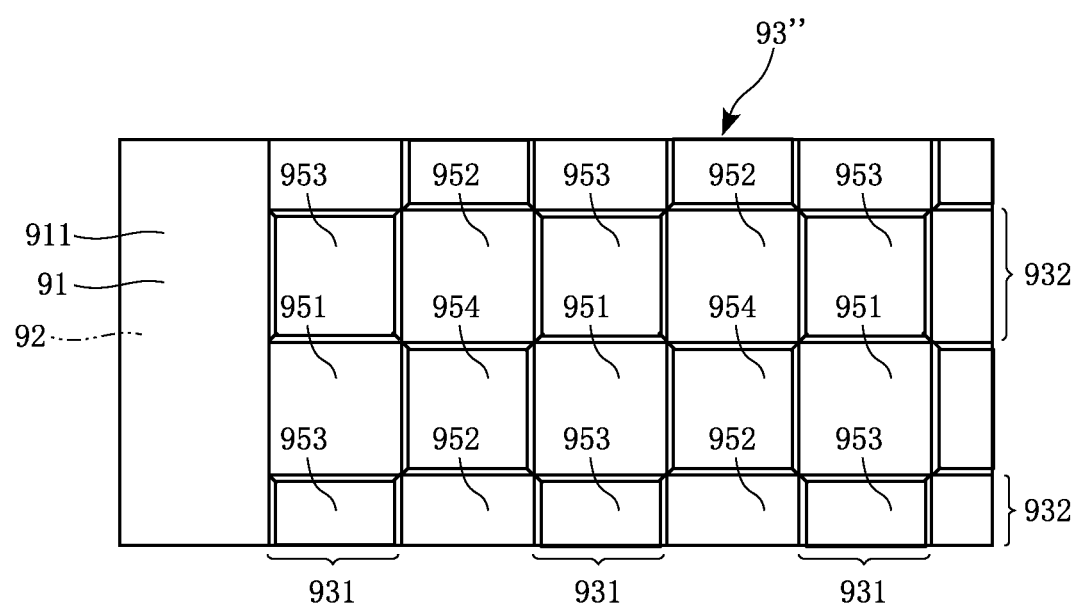
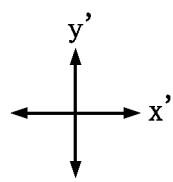

FIG.15 A3
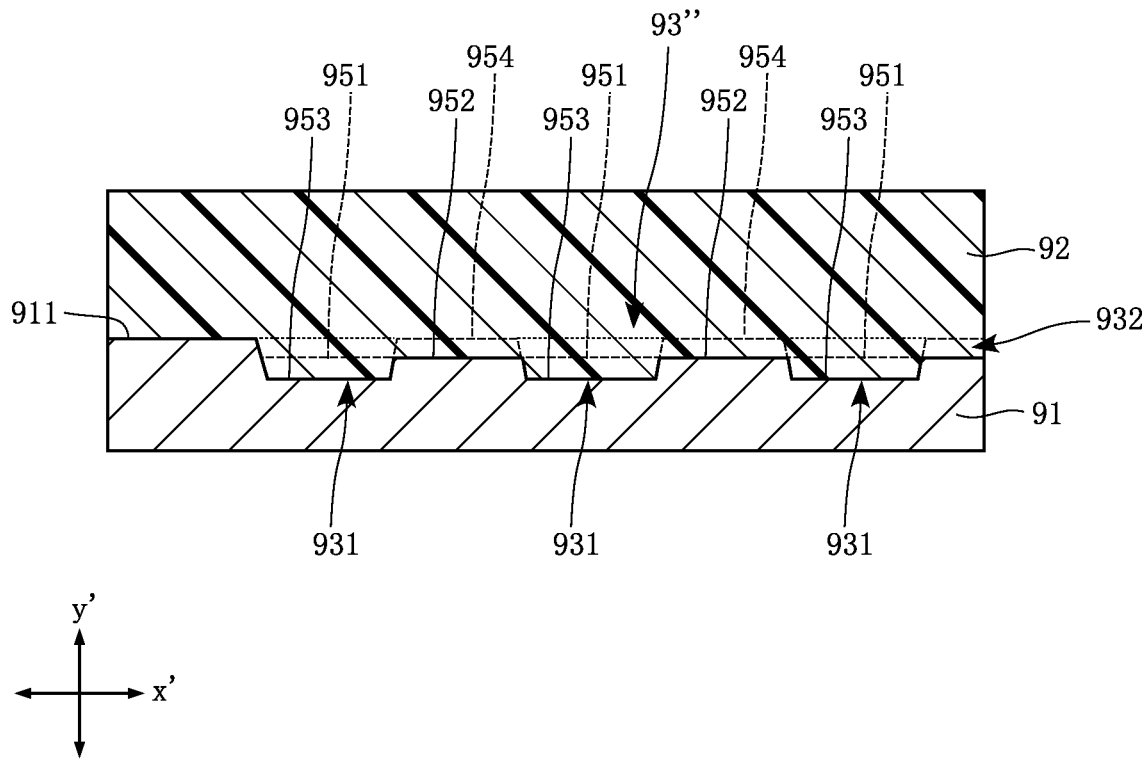
FIG.16 A3
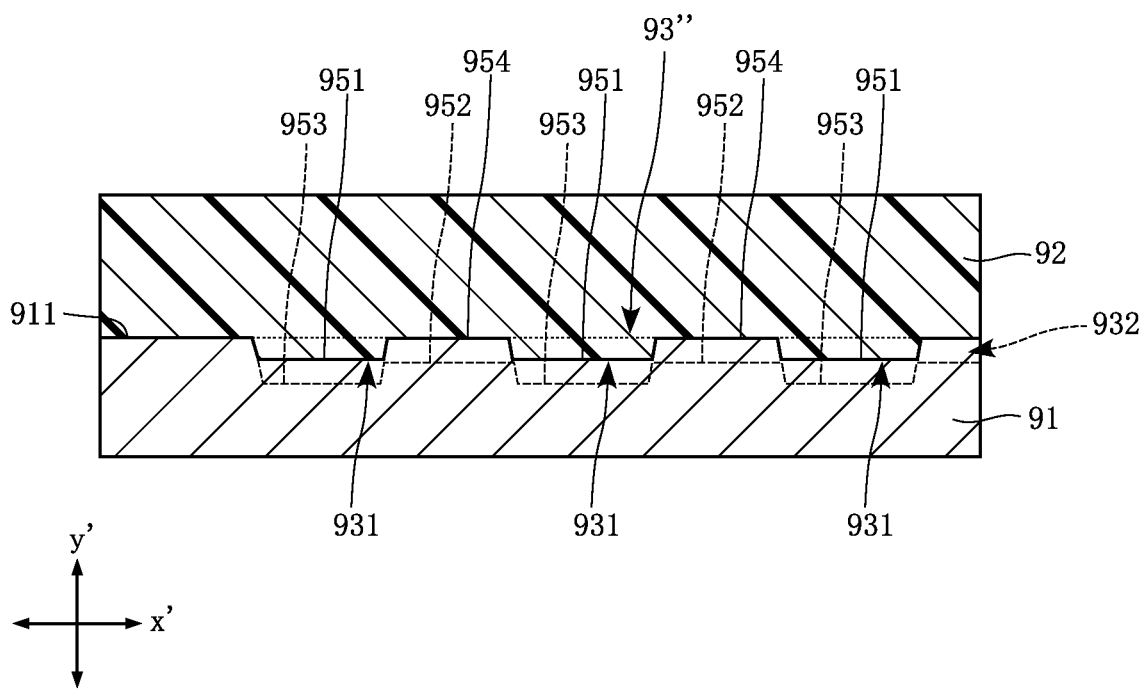

FIG.23
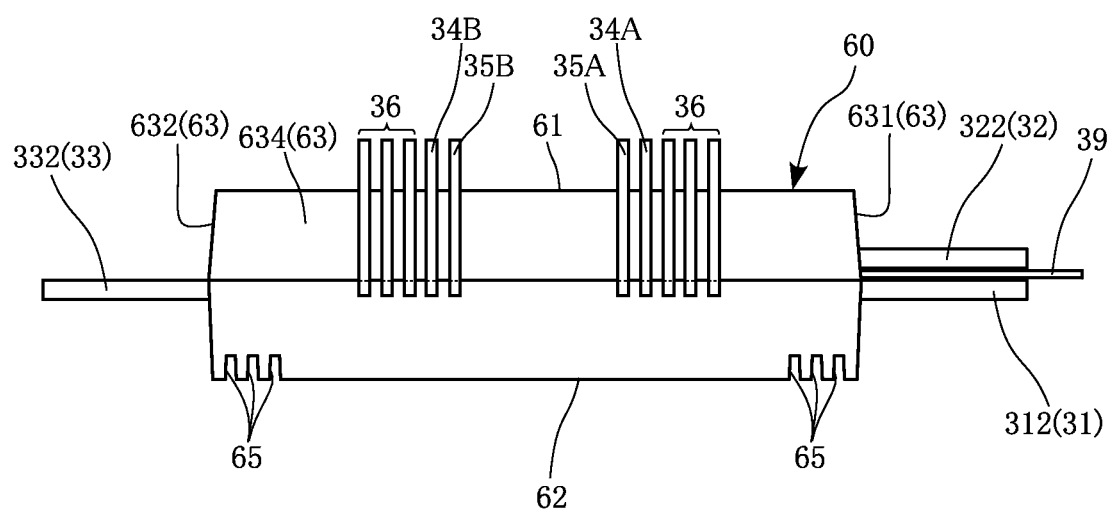
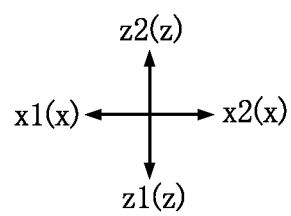

PACKAGE STRUCTURE, SEMICONDUCTOR DEVICE, AND FORMATION METHOD FOR PACKAGE STRUCTURE

TECHNICAL FIELD

The present disclosure relates to a package structure including a metal member and a resin member, a semiconductor device including such a package structure, and a method for forming such a package structure.

BACKGROUND ART

Patent Document 1 discloses a conventional semiconductor device. The semiconductor device described in the document includes a lead frame (metal member), a semiconductor element and a molding resin (resin member). The semiconductor element is mounted on the lead frame. The molding resin covers the semiconductor element and a part of the lead frame. The molding resin adheres to the lead frame and thus supported on the lead frame.

PRIOR ART DOCUMENT

Patent Document

Patent Document 1: JP-A-2006-310609

SUMMARY OF THE INVENTION

Problem to be Solved by the Invention

A conventional semiconductor device is provided with a molding resin for preventing corrosion of the lead frame and protecting the semiconductor element. It is therefore important to prevent peeling of the molding resin.

The present disclosure has been conceived in view of the problem noted above and aims to provide a package structure designed to prevent peeling of the resin member from the metal member. The present disclosure also aims to provide a semiconductor device including such a package structure and a method for forming such a package structure.

Means to Solve the Problem

A first aspect of the present disclosure provides a package structure including: a metal member having an obverse surface facing one side in a first direction; and a resin member disposed in contact with at least a portion of the obverse surface. The obverse surface has a roughened area. The roughened area includes a plurality of first trenches recessed from the obverse surface, each of the first trenches having a surface with a greater roughness than the obverse surface. The plurality of first trenches extend in a second direction perpendicular to the first direction and are next to each other in a third direction perpendicular to the first direction and the second direction. The plurality of first trenches are filled up with the resin member.

According to a preferred embodiment of the package structure, each of the plurality of first trenches as viewed in the first direction is continuous from one edge of the roughened area in the second direction to another edge of the roughened area in the second direction.

According to a preferred embodiment of the package structure, each of the plurality of first trenches as viewed in the first direction extends linearly in the second direction.

According to a preferred embodiment of the package structure, the roughened area of the obverse surface includes a ridge between two of the plurality of first trenches adjacent to each other in the third direction. As viewed in the first direction, the ridge is continuous from one edge of the roughened area in the second direction to another edge of the roughened area in the second direction.

According to a preferred embodiment of the package structure, the roughened area further includes a plurality of second trenches each of which has a surface with a greater roughness than the obverse surface. The plurality of second trenches extend in the third direction and are next to each other in the second direction. As viewed in the first direction, each of the first trenches intersects each of the plurality of second trenches.

According to a preferred embodiment of the package structure, the roughened area has an intersection bottom surface and a non-intersection bottom surface. As viewed in the first direction, the intersection bottom surface overlaps with one of the plurality of first trenches and one of the plurality of second trenches. As viewed in the first direction, the non-intersection bottom surface overlaps with only one of the plurality of first trenches or only one of the plurality of second trenches are located. The intersection bottom surface is more distant in the first direction from the obverse surface than the non-intersection bottom surface.

According to a preferred embodiment of the package structure, as viewed in the first direction, each of the plurality of second trenches extends linearly.

According to a preferred embodiment of the package structure, a distance between two adjacent first trenches out of the plurality of first trenches is substantially equal to a distance between two adjacent second trenches out of the plurality of second trenches.

According to a preferred embodiment of the package structure, each of the plurality of first trenches has a profile with a curved edge in a section taken perpendicular to the second direction.

According to a preferred embodiment of the package structure, each of the first trenches has finer surface asperities than asperities provided by the plurality of first trenches on the roughened area.

According to a preferred embodiment of the package structure, the plurality of first trenches has a surface layer that is an oxide layer composed of an oxide of a substance of the metal member.

According to a preferred embodiment of the package structure, the plurality of first trenches are arranged at a predetermined pitch.

According to a preferred embodiment of the package structure, each of the plurality of first trenches has a width of 10 to 200 μm.

According to a preferred embodiment of the package structure, each of the plurality of first trenches has a depth and a width such that a ratio of the depth to the width is within a range of 0.2 to 1.2.

A second aspect of the present disclosure provides a semiconductor device including a package structure in accordance with the first aspect of the present disclosure. The semiconductor device includes: a first switching element; and a first terminal and a second terminal each of which is electrically connected to the first switching element. The resin member covers the first switching element, a portion of the first terminal and a portion of the second terminal. The first terminal includes a roughened area.

According to a preferred embodiment of the semiconductor device, the first terminal has a first pad portion covered with the resin member and a first terminal portion exposed from the resin member. The roughened area is formed at an edge of the first pad portion connected to the first terminal portion.

According to a preferred embodiment of the semiconductor device, the second terminal includes a roughened area.

According to a preferred embodiment of the semiconductor device, the second terminal has a second pad portion covered with the resin member and a second terminal portion exposed from the resin member. The roughened area of the second terminal is formed at an edge of the second pad portion connected to the second terminal portion.

According to a preferred embodiment of the semiconductor device, the semiconductor device further includes: an insulating substrate having a substrate obverse surface facing the side in the first direction; and a first conductive member disposed on the substrate obverse surface and electrically bonded to the first switching element. The first terminal is electrically bonded to the first conductive member.

According to a preferred embodiment of the semiconductor device, the first conductive member has a roughened area on at least a part of a surface bonded to the first switching element.

According to a preferred embodiment of the semiconductor device, the semiconductor device further includes: a second conductive member disposed on the substrate obverse surface and spaced apart from the first conductive member; a second switching element that is different from the first switching element and electrically bonded to the second conductive member; and a third terminal electrically bonded to the second conductive member. The third terminal has a third pad portion covered with the resin member and a third terminal portion exposed from the resin member. The second switching element is electrically connected to the first conductive member.

According to a preferred embodiment of the semiconductor device, the second conductive member has a roughened area on at least a part of a surface on which the second switching element is bonded.

According to a preferred embodiment of the semiconductor device, the semiconductor device further includes an insulating member disposed between the second terminal portion and the third terminal portion in the first direction. As viewed in the first direction, a portion of the insulating member overlaps with the second terminal portion and the third terminal portion.

A third aspect of the present disclosure provides a method for forming a package structure. The method includes: a step of preparing a metal member having an obverse surface facing one side in a first direction; a surface roughening step of processing at least a part of the obverse surface to form a roughened area; and a resin member forming step of forming a resin member in contact with at least the roughened area. The roughened area includes a plurality of first trenches recessed from the obverse surface, each of the first trenches having a surface with a greater roughness than the obverse surface. The plurality of first trenches extend in a second direction perpendicular to the first direction and are next to each other in a third direction perpendicular to the first direction and the second direction. The plurality of first trenches are filled up with the resin member.

According to a preferred embodiment of the method, the surface roughening step includes forming the plurality of first trenches by irradiating the metal member with a laser beam.

Effects of the Invention

The package structure according to the present disclosure is configured to prevent peeling of the resin member from the metal member. Also, the semiconductor device according to the present disclosure is configured to be resistant to peeling of the resin member from the metal member, thereby preventing the semiconductor element from being exposed to ambient environment. Also, the method of forming a package structure according to the present disclosure enables the production of such a package structure.

BRIEF DESCRIPTION OF THE DRAWINGS

FIG. 1 is a plan view of a package structure according to a first embodiment.
FIG. 2 is a sectional view taken along line II-II of FIG. 1.
FIG. 3 is an enlarged plan view of area III of FIG. 1, showing a roughened area of the first embodiment.
FIG. 12 is a sectional view taken along line XII-XII of FIG. 11.
FIG. 13 is an enlarged plan view of a package structure according to a third embodiment, showing a roughened area of the third embodiment.
FIG. 15 is a sectional view taken along line XV-XV of FIG. 14.
FIG. 16 is a sectional view taken along line XVI-XVI of FIG. 14.
FIG. 23 is a front view of the semiconductor device.

MODE FOR CARRYING OUT THE INVENTION

With reference to the drawings, the following describes preferred embodiments of a package structure, a semiconductor device and a method for forming a package structure. In the following description, the same or similar elements are denoted by the same reference signs, and a description of such an element will not be repeated.

Figure 4:
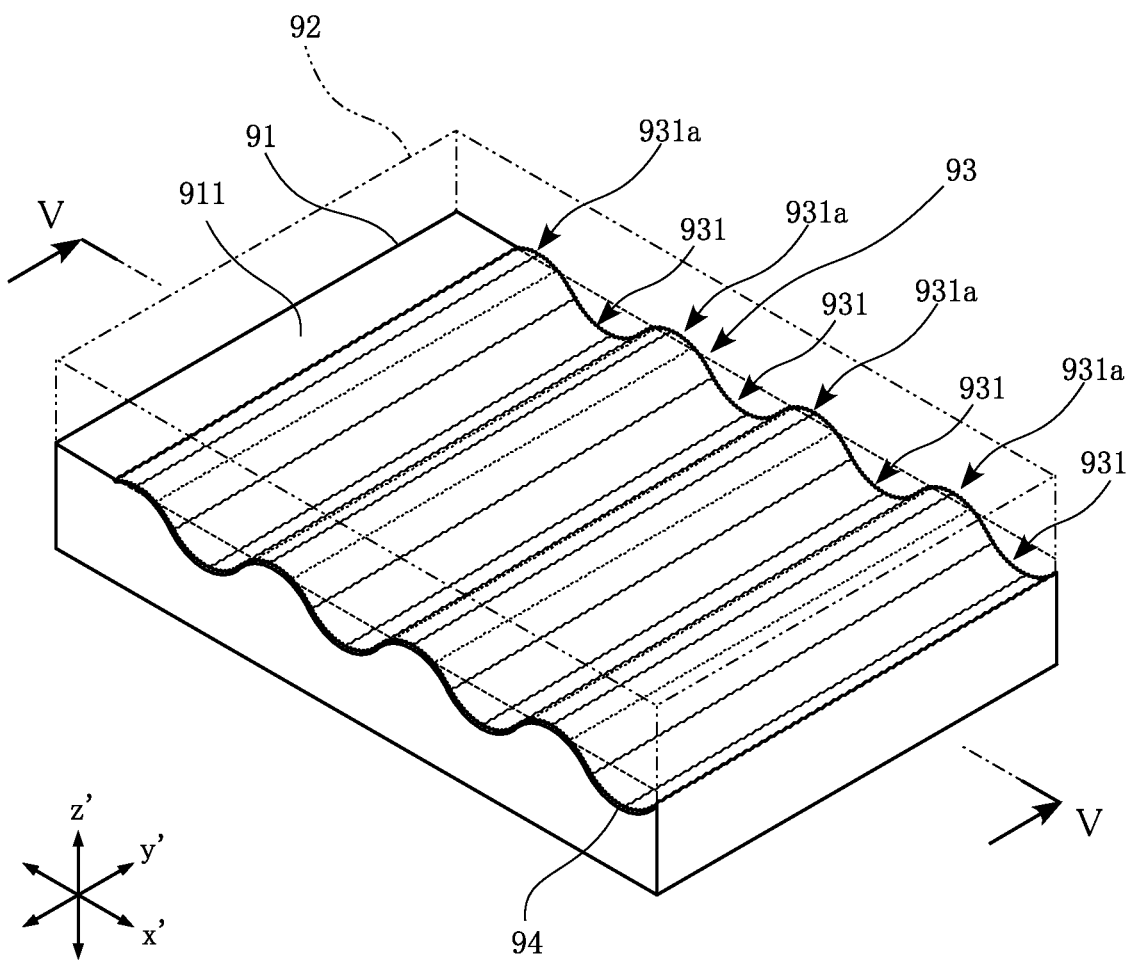
FIG. 4 is a perspective view of the part shown in FIG. 3.
Figure 5:
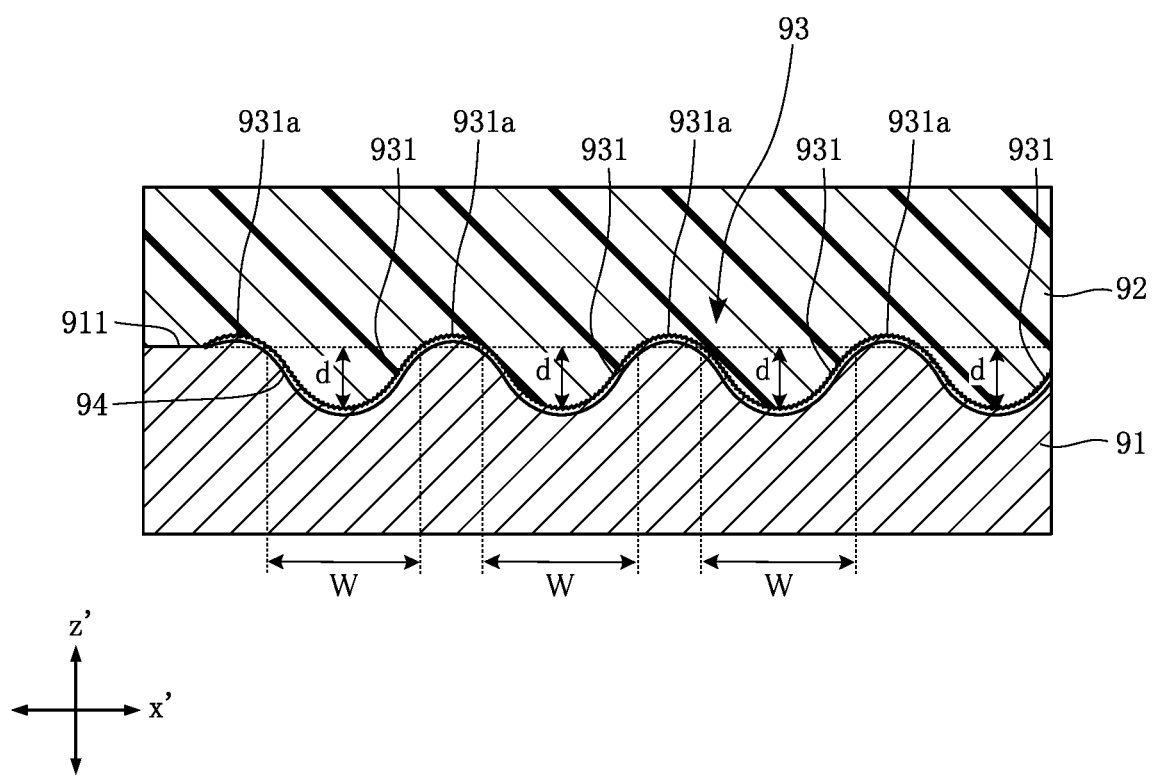
FIG. 5 is a sectional view taken along line V-V of FIG. 4.

First, a package structure according to a first embodiment of the present disclosure will be described with reference to FIGS. 1 to 5. A package structure A1 of the first embodiment includes a metal member 91 and a resin member 92. FIG. 1 is a plan view of the package structure A1. FIG. 2 is a sectional view taken along line II-II of FIG. 1. FIG. 3 is an enlarged view of area III shown in FIG. 1. FIG. 4 is a perspective view of the part shown in FIG. 3. FIG. 5 is a sectional view taken along line V-V of FIG. 4. FIGS. 1, 3 and 4 show the resin member 92 in phantom (in two-dot chain line).

For convenience, FIGS. 1 to 5 define three directions perpendicular to each other as x', y' and z' directions. In particular, the z' direction corresponds to the thickness direction of the package structure A1. The x' direction corresponds to the horizontal direction as seen in plan view of the package structure A1 (see FIG. 1). The y' direction corresponds to the vertical direction as seen in plan view of the package structure A1 (see FIG. 1).

The metal member 91 may be a metal plate, for example. The metal plate may be made of copper (Cu) or a Cu alloy, for example. In one example, the metal member 91 has a thickness of 0.8 mm or 3.0 mm, but this is not a limitation. The metal member 91 has an obverse surface 911. The obverse surface 911 faces one side in the z' direction (in the present embodiment, it is an upper direction as seen in FIG. 2).

The resin member 92 is disposed on and in contact with the obverse surface 911 of the metal member 91. The resin member 92 may be made of an epoxy resin, for example. The material of the resin member 92, however, is not limited to an epoxy resin. The resin member 92 contains fillers.

In the package structure A1, the obverse surface 911 of the metal member 91 has a roughened area 93. The roughened area 93 is covered with the resin member 92. The roughened area 93 is formed by roughening an area of the obverse surface 911 of the metal member 91. In a non-limiting example, the roughened area 93 may be formed by laser irradiation. In another example, the roughened area 93 may be formed by etching. The roughened area 93 includes a plurality of first elongated trenches 931 and a plurality of ridges 931a.

The first elongated trenches 931 are recessed from the obverse surface 911. The first elongated trenches 931 extend in the y' direction. As viewed in the z' direction, each first elongated trench 931 is continuous from one edge of the roughened area 93 in the y' direction to the other edge. Each first elongated trench 931 extends linearly as viewed in the z' direction. The first elongated trenches 931 are arranged in a predetermined regular pattern. As viewed in the z' direction, the first elongated trenches 931 are next to each other in the x' direction. The first elongated trenches 931 are equally spaced apart in the x' direction. Each first elongated trench 931 has a curved profile in a section taken along a plane perpendicular to the y' direction (x'-z' plane). The sectional profile is recessed toward one side in the z' direction (downward as seen in FIG. 5).

The first elongated trenches 931 have an x'-direction dimension W (see FIG. 5) of about 10 to 200 μm (about 15 to 25 μm in the present embodiment), for example. The first elongated trenches 931 have a depth d (see FIG. 5) of about 10 to 40 μm (about 10 to 20 μm in the present embodiment), for example. The ratio of the x'-direction dimension W to the depth d (d/W) is about 0.2 to 1.2 (about 0.6 to 0.7 in the present embodiment). The x'-direction dimension W of the first elongated trenches 931 is smaller than the size of the fillers contained in the resin member 92.

As shown in FIGS. 3 to 5, each ridge 931a is located between two first elongated trenches 931 adjacent in the x' direction. In FIGS. 4 and 5, the ridges 931a is raised upward in the z' direction to extend beyond the obverse surface 911. Alternatively, however, the ridges 931a may terminate without extending beyond the obverse surface 911. Each ridge 931a is connected to each first elongated trench 931 that is adjacent to the ridge 931a in the x' direction. In particular, each ridge 931a is connected to an edge of such a first elongated trench 931 closer in the x' direction. Similarly to the first elongated trenches 931, the ridges 931a extend in the y' direction. As viewed in the z' direction, each first ridge 931a is continuous from one edge of the roughened area 93 in the y' direction to the other edge. Each ridge 931a extends linearly as viewed in the z' direction. As viewed in the z' direction, the ridges 931a are next to each other in the x' direction.

The first elongated trenches 931 and the ridges 931a of the roughened area 93 have a surface layer that is an oxide layer 94 as shown in FIGS. 4 and 5. The oxide layer 94 is made by oxidizing a substance of the metal member 91. The present inventor analyzed the surface of the metal member 91 and confirmed that an anticorrosive component (such as benzotriazole) was detected from the area of the obverse surface 911 other than the roughened area 93 but not from the roughened area 93. Although not specifically limited, the thickness of the oxide layer 94 may be about 20 nm, for example.

The roughened area 93 has fine surface asperities on the first elongated trenches 931 and also on the ridges 931a. The fine asperities increase the surface roughness of the roughened area 93 to a level exceeding the roughness of the obverse surface 911. The surface asperities are finer than the asperities provided by the first elongated trenches 931 and the ridges 931a. Each first elongated trench 931 has a surface roughness Ra (by arithmetical mean) of about 2.51 μm, for example, and each ridge 931a has a surface roughness Ra of about 2.46 μm, for example. Since the first elongated trenches 931 and the ridges 931a are formed by laser irradiation as mentioned above, weld marks (such as weld beads) are formed on their surfaces. Although the weld marks are not shown in FIGS. 1 to 5, at least some of the asperities are provided by the weld marks.

Next, a method for forming a package structure A1 according to the first embodiment of the present disclosure will be described with reference to FIGS. 6 and 7.

First, a metal member 91 having an obverse surface 911 is prepared. For example, a metal plate is prepared as the metal member 91. The metal plate is not required to have any specific thickness.

Next, at least a part of the obverse surface 911 of the metal member 91 is roughened. As a result, a roughened area 93 is formed on the obverse surface 911. The process of roughening the obverse surface 911 (surface roughening step) involves emitting a laser beam onto the obverse surface 911. As a result, dimples are formed at the regions of the metal member 91 impinged on by the laser beam. Upon impingement of the laser beam, heat is generated to sublimate and melt the material present at the impinged regions. When the molten material later solidifies, fine asperities as described above are formed on the surface. The laser irradiation process may be performed by using a laser emitting device LD (see FIG. 6) described below.

Figure 6:
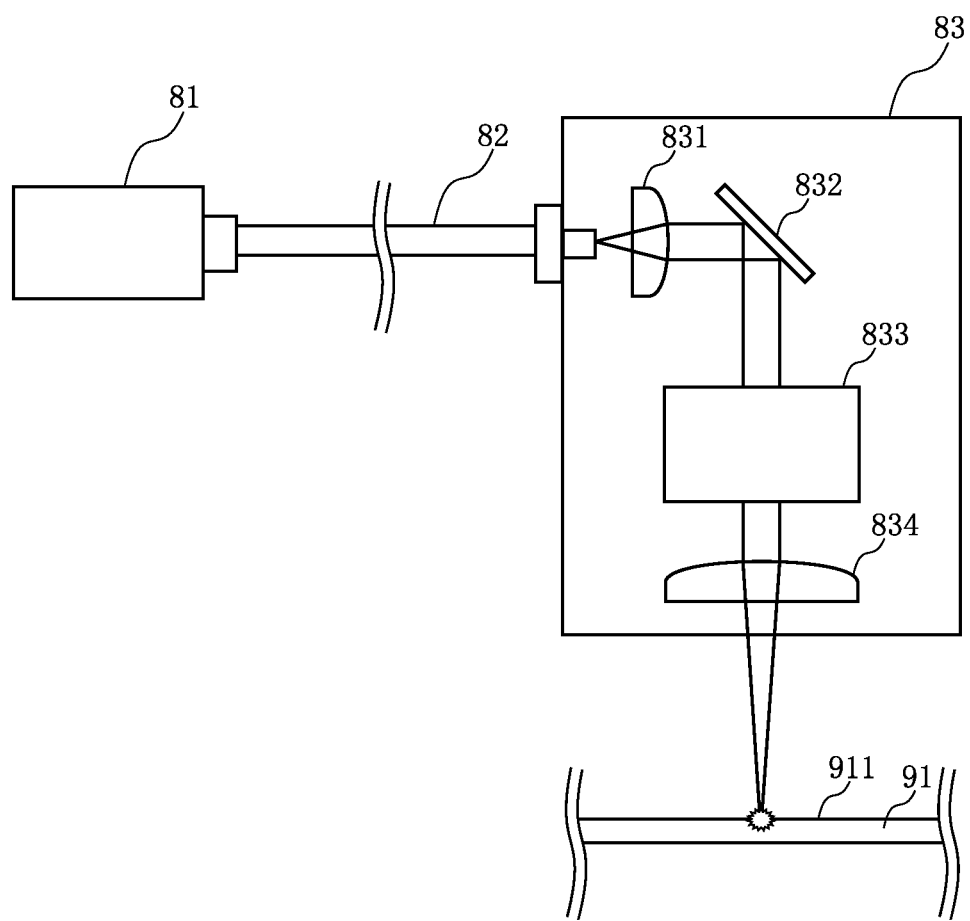
FIG. 6 is a schematic view of an example of a laser emitting device.

FIG. 6 shows an example of the laser emitting device LD. As shown in FIG. 6, the laser emitting device LD includes a laser oscillator 81, an optical fiber 82 and a laser head 83. The laser oscillator 81 emits a laser beam. In the present embodiment, the laser oscillator 81 emits a YAG laser beam. The optical fiber 82 transmits the laser beam emitted by the laser oscillator 81. The laser head 83 is used to direct the laser beam output from the optical fiber 82 onto the metal member 91.

The laser head 83 includes a collimating lens 831, a mirror 832, a galvano scanner 833 and a condensing lens 834. The collimating lens 831 collimates a laser beam output from the optical fiber 82 (into parallel rays). The mirror 832 reflects the laser beam collimated by the collimating lens 831 toward the metal member 91. The galvano scanner 833 is used to steer the laser beam to change the incident position of the laser beam on the metal member 91. The galvano scanner 833 may be a well-known scanner including a pair of movable mirrors (not shown) capable of swinging in two mutually perpendicular directions. The condensing lens 834 collects the laser beam output from the galvano scanner 833 onto the metal member 91.

The surface roughening process of the present embodiment uses the laser emitting device LD to emit a laser beam onto the metal member 91. During the process, the laser beam is steered to move the incident position according to a predetermined laser irradiation pattern. FIG. 7 is a view for illustrating the laser irradiation pattern of the present embodiment. As described above, the laser beam is steered by the galvano scanner 833. The spot diameter Ds of the laser beam incident on the obverse surface 911 of the metal member 91 is about 20 µm, for example. The spot diameter Ds refers to the spot size (diameter) formed on the obverse surface 911 of the metal member 91 by the laser beam emitted from the laser emitting device LD. The laser beam travels at a speed of about 200 mm/s.

Figure 7:
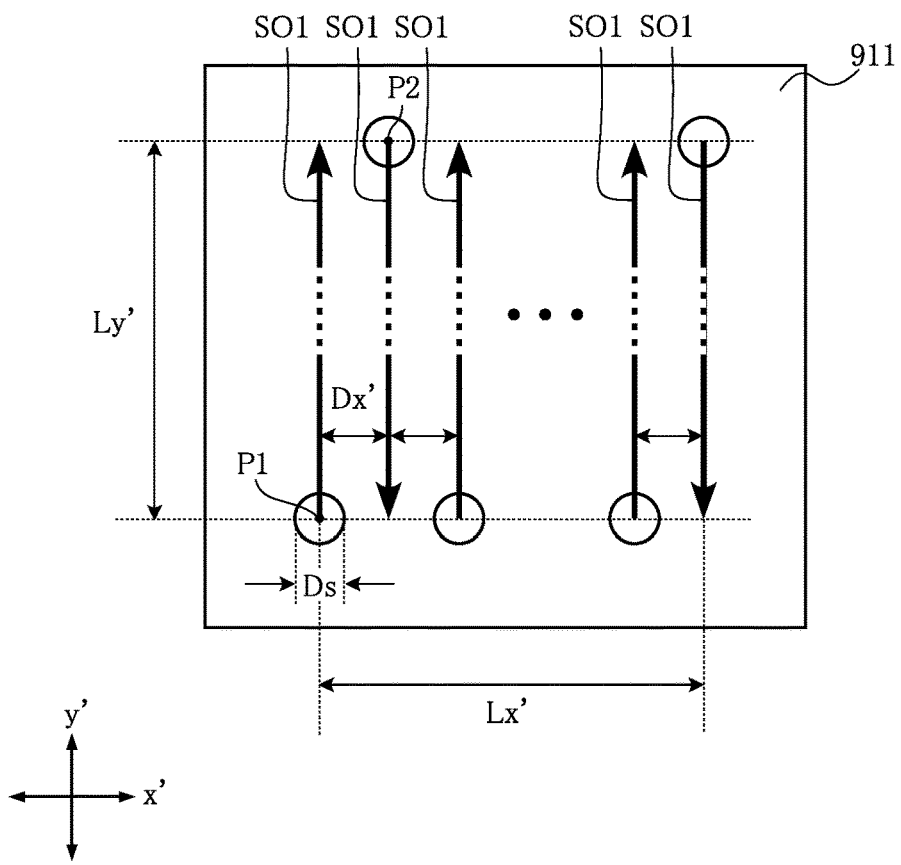
FIG. 7 is a view of a laser irradiation pattern according to the first embodiment.

As shown in FIG. 7, the laser irradiation pattern of this embodiment is composed of a plurality of lines (as indicated by bold arrows). In particular, a plurality of scan paths SO1 extend in the y' direction and equally spaced apart in the x' direction. The scan paths SO1 define straight lines that are parallel to each other. Note that the scan paths SO1 shown in FIG. 7 indicate the paths for the center of the laser beam to follow.

In the surface roughening process, the laser beam is first directed to the point P1 shown in FIG. 7 as a starting point. The laser beam is then moved along the scan path SO1 that starts from the point P1 by the distance Ly' in the y' direction. Next, the laser beam is directed to the point P2 and moved along the scan path SO1 that starts from the point P2 by the distance Ly' in the y' direction. The distance between the scan paths SO1, which means the pitch Dx' of the scan paths SO1 (see FIG. 7), is about 33 µm, for example. In the present embodiment, as shown in FIG. 7, the laser beam is scanned in the y' direction alternately from a lower position to an upper position and from an upper position to a lower position as seen in FIG. 7. In another example, all the scan paths SO1 may be scanned from a lower position to an upper position (or from an upper position to a lower position) as seen in the figure. The surface roughening process of this embodiment scans the laser beam along the scan paths SO1 in the manner described above. The travel amounts of the laser beam in the y' direction (distance Ly') and the x' direction (distance Lx') are determined based on the area intended for forming the roughened area 93.

In the surface roughening process, a laser beam is scanned according to the laser irradiation pattern shown in FIG. 7. As a result, heat is generated at the regions of the metal member 91 exposed to the laser beam to sublimate and melt the regions of the metal member 91. Since the generated heat diffuses in the metal member 91, a region that is wider than the spot diameter Ds will melt. As a result, regions of the metal member 91 melt by each scanning overlap between the adjacent scan paths as shown in FIG. 7, and these overlapping regions will form ridges 931a in the roughened area 93. In the present embodiment, in addition, the laser beam is moved along the linear scan paths SO1, so that the first elongated trenches 931 corresponding the scan paths SO1 are formed. Thus, the first elongated trenches 931 formed in this manner extend linearly in the y' direction and in parallel in the x' direction.

Subsequently, a resin member 92 is formed to cover the roughened area 93. The process of forming the resin member 92 (resin member forming step) may employ transfer molding, for example.

Through the processes described above, the package structure A1 is formed by the metal member 91 having the roughened area 93 and the resin member 92 covering the roughened area 93.

Next, the following describes advantageous effects of the package structure A1 according to the first embodiment and the method for forming the same.

The package structure A1 has a roughened area 93 formed on the obverse surface 911 of the metal member 91. The roughened area 93 includes a plurality of first elongated trenches 931. The first elongated trenches 931 are recessed from the obverse surface 911, and the surface of the first elongated trenches 931 is coarsened as compared to the obverse surface 911. In addition, the first elongated trenches 931 are filled up with the resin member 92. This configuration contributes to the anchoring effect of increasing the strength of adhesion between the obverse surface 911 of the metal member 91 and the resin member 92. The package structure A1 is therefore effective to prevent peeling of the resin member 92 from the metal member 91. Consequently, the obverse surface 911 of the metal member 91 can be protected from corrosion.

The present inventor evaluated the package structure A1 for the adhesion strength between the metal member 91 and the resin member 92. To evaluate the adhesion strength, a pudding-cup shear test was performed to measure a shear strength. In the shear test, a resin member 92 having a pudding-cup shape was formed on a roughened area 93. Then, a force was applied to the pudding-cup shaped resin member 92 by a shearing tool, and the shear stress was measured upon peeling of the resin member 92 from the metal member 91. For comparison, the same shear test was conducted on a metal member 91 not having a roughened area 93. The shear test was conducted under the following conditions. The resin member 92 was formed into a frustoconical pudding-cup shape with a height of 3.0 mm and a base diameter of 3.6 mm. In addition, the shearing tool having a tool width of 9 mm, a tool height of 100 µm and a traveling speed of 50 µ/s was used. The measurement was performed at an ambient temperature of 25° C.

As a result of the shear test, the metal member 91 having the roughened area 93 exhibited a shear strength of 30.41 kgf in the direction normal to the first elongated trenches 931 (hereinafter, normal direction) and a shear strength of 31.09 kgf in the direction parallel to the first elongated trenches 931 (hereinafter, parallel direction). Thus, the average value of the shear strengths was 30.75 kgf. In contrast, the metal member 91 not having the roughened area 93 exhibited a shear strength of 5.47 kgf in the normal direction and a shear strength of 5.81 kgf in the parallel direction. Thus, the average of the shear strengths was 5.64 kgf. That is, the average shear strength of the metal member 91 having the roughened area 93 on the obverse surface 911 was about 5.5 times higher than that of the metal member 91 not having the roughened area 93. That is, the presence of the roughened area 93 served to increase the adhesion strength between the metal member 91 and the resin member 92. Thus, forming the roughened area 93 on the metal member 91 of the package structure A1 is effective to increase the strength of adhesion between the metal member 91 and the resin member 92. The results of the shear test also show that the shear strength was increased in the parallel direction to the first elongated trenches 931, in addition to the normal direction.

In the package structure A1, the x'-direction dimension of each first elongated trench 931 is smaller than the particle size of the fillers contained in the resin member 92. Therefore, the fillers cannot enter the first elongated trenches 931. This ensures that no fillers are present at the interface between the metal member 91 and the resin member 92. This is effective to reduce the risk of interface failure between the metal member 91 and the resin member 92.

According to the method of forming the package structure A1, the roughened area 93 is formed by using a laser beam in the surface roughening process. The laser beam is scanned along the linear scan paths SO1. As a result, the first elongated trenches 931 are formed in the roughened area 93. In addition, since the laser beam causes regions of the metal member 91 to sublime and melt and then solidify, fine asperities are formed on the surface of the first elongated trenches 931. That is, the surface roughening process of forming the roughened area 93 by a laser beam works to form the first elongated trenches 931 and also to roughen the surface of first elongated trenches 931.

According to the first embodiment, the first elongated trenches 931 have a surface roughness Ra of about 2.51 μm, and the ridges 931a have a surface roughness Ra of about 2.46 μm, which however are not a limitation. The values of the surface roughness Ra may be smaller than the values of this example. In order to examine the relation between the surface roughness Ra and the shear strength, the present inventor conducted a similar shear test on a sample having the first elongated trenches 931 with a surface roughness Ra of about 1.59 μm and the ridges 931a with a surface roughness Ra of about 0.98 μm. The results show that the sample with the lower surface roughness Ra exhibited a shear strength of 31.26 kgf in the normal direction and 26.21 kgf in the parallel direction. As described above, the shear strength measured on a sample of the first embodiment was 30.41 kgf in the normal direction and the 31.09 kgf in the parallel direction. That is, the presence of a roughened area 93 with a lower surface roughness Ra is still effective to qualitatively increase the shear strength, although the increase is quantitively less than the increase achieved by the first embodiment. As clarified above, the adhesion strength can be increased by forming the first elongated trenches 931, and the shear strength can be quantitively adjusted by adjusting the surface roughness Ra of the roughened area 93. In particular, the shear strength is quantitively increased by increasing the surface roughness Ra of the roughened area 93.

Figure 8:
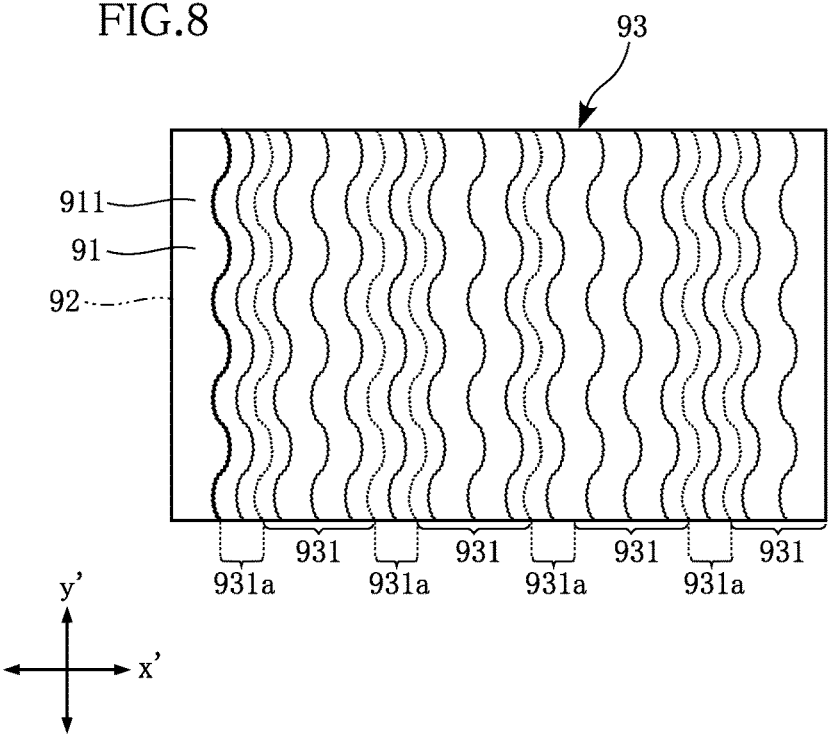
FIG. 8 is a plan view of a roughened area according to a variation of the first embodiment.
Figure 9:
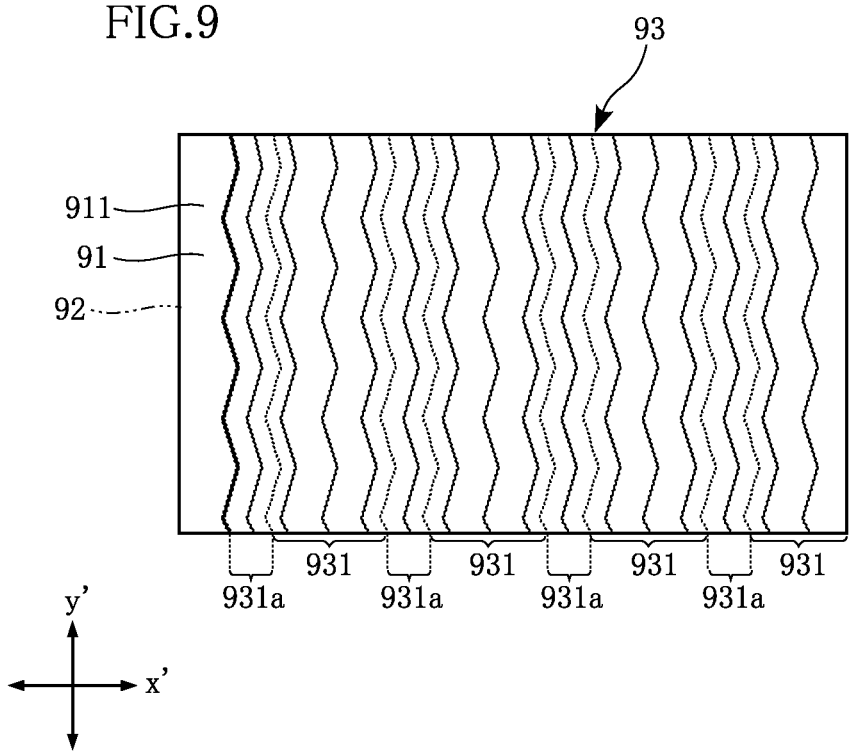
FIG. 9 is a plan view of a roughened area according to another variation of the first embodiment.

The first embodiment is directed to the case where the first elongated trenches 931 extends in straight lines. The first elongated trenches 931, however, are not limited to the linear trenches, and trenches extending in wavy or zigzag lines may be used. The first elongated trenches 931 extending in wavy or zigzag lines may be formed by the surface roughening process of moving a laser beam according to a laser irradiation pattern composed of wavy or zigzag paths, instead the laser irradiation pattern composed of straight paths (see FIG. 7). FIG. 8 is a plan view of the package structure A1 having the first elongated trenches 931 extending in wavy lines. FIG. 9 is a plan view of the package structure A1 having first elongated trenches 931 extending in zigzag lines. In the present disclosure, zigzag lines are not limited to those having a series of turns at a right angle but also refer to lines having turns at an acute or obtuse angle. In the example shown in FIG. 9, the first elongated trenches 931 have turns at an obtuse angle. The package structures A1 shown in FIGS. 8 and 9 can improve the shear strength as achieved by the package having the linearly extending first elongated trenches 931. Therefore, either variation of the package structure A1 is effective to improve the strength of adhesion between the metal member 91 and the resin member 92.

Next, a package structure according to a second embodiment of the present disclosure will be described with reference to FIGS. 10 to 12. A package structure A2 according to the second embodiment has a roughened area 93', which is different from the roughened area 93, on the obverse surface 911 of the metal member 91. As for the overall configuration, the package structure A2 is the same as the package structure A1 shown in FIGS. 1 and 2.

Figure 10:
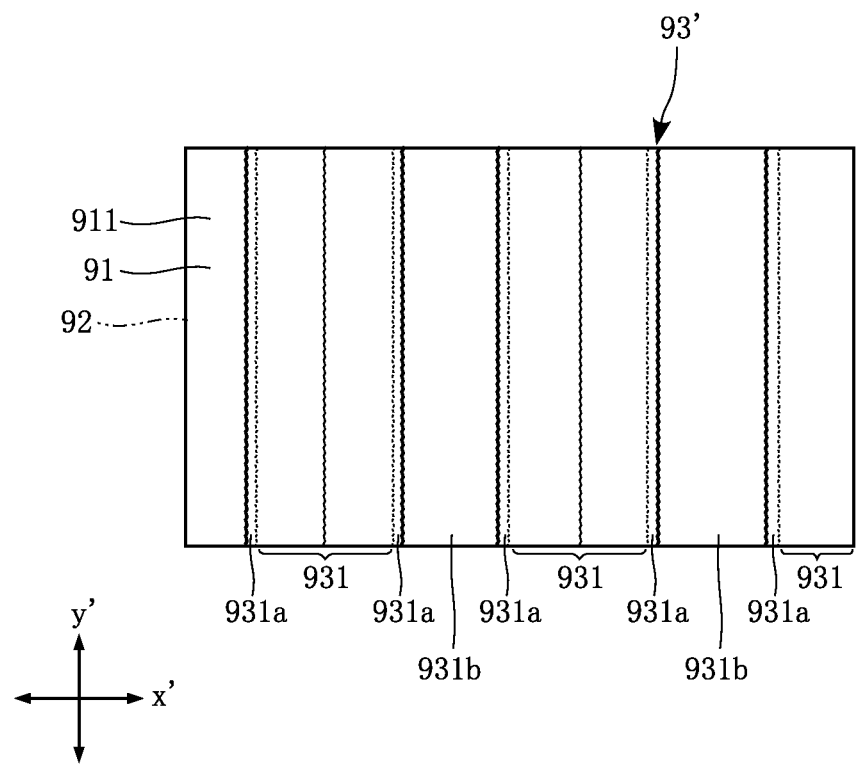
FIG. 10 is an enlarged plan view of a package structure according to a second embodiment, showing a roughened area of the second embodiment.
Figure 11:
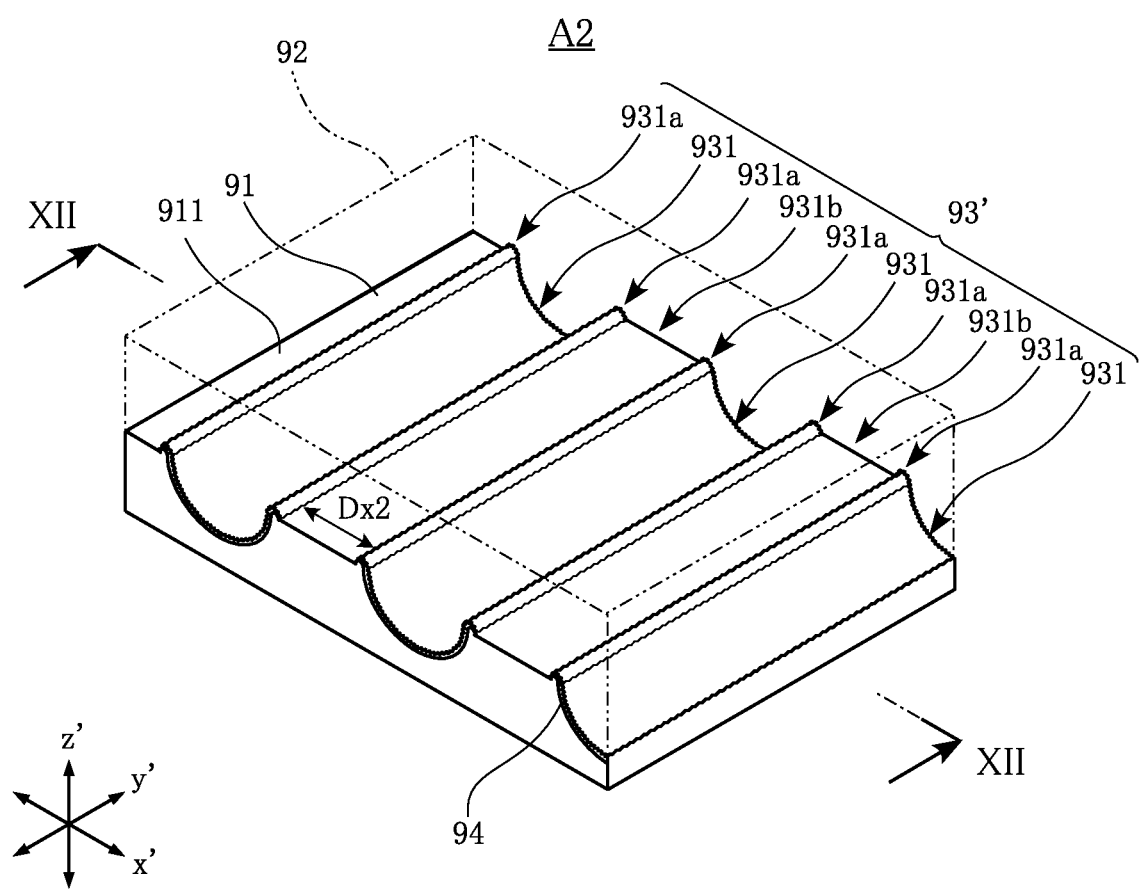
FIG. 11 is a perspective view of the part shown in FIG. 10.

FIGS. 10 to 12 show the roughened area 93'. FIG. 10 is an enlarged plan view of the roughened area 93' and corresponds to FIG. 3 associated with to the first embodiment. FIG. 11 is a perspective view of the part shown in FIG. 10. FIG. 12 is a sectional view taken along line XII-XII of FIG. 11.

As shown in FIGS. 10 to 12, the roughened area 93' includes a plurality of first elongated trenches 931, a plurality of ridges 931a and a plurality of intermediate portions 931b. Unlike the roughened area 93, the roughened area 93' has the intermediate portions 931b and the ridges 931a of a different configuration. As shown in FIGS. 10 to 12, the roughened area 93' includes, in a repeated sequence, a first elongated trench 931, a ridge 931a, an intermediate portion 931b and a ridge 931a in the x' direction.

As shown in FIGS. 10 to 12, each intermediate portion 931b is located between two adjacent first elongated trenches 931, and thus between two adjacent ridges 931a, in the x' direction. The intermediate portions 931b have the same surface roughness as the obverse surface 911. That is, the surface roughness of the intermediate portions 931b is the original surface roughness of the metal member 91. The x'-direction dimension Dx2 (see FIG. 11) of the intermediate portions 931b is determined by the pitch Dx' of the scan paths SO1. The intermediate portions 931b are flush with the obverse surface 911.

As shown in FIGS. 10 to 12, each ridge 931a in the roughened area 93' is connected to one of the two edges of a first elongated trenches 931 opposite in the x' direction. That is, one of the two edges of each ridge 931a opposite in the first direction is connected to a first elongated trench 931, and the other to an intermediate portion 931b.

Next, a method for forming the package structure A2 according to the second embodiment will be described.

The method according to this embodiment is different in the laser irradiation pattern used in the surface roughening process. More specifically, the pitch Dx' of the scan paths SO1 is different. The pitch Dx' of the scan paths SO1 in this embodiment is about 66 μm or about 99 μm, both of which are greater than the pitch Dx' of about 33 μm used in the first embodiment. Since the pitch Dx' of the scan paths SO1 is greater, the regions of the metal member 91 sublimed or melt by each scanning no longer overlap between the adjacent scan paths SO1. That is, there are regions left unaffected between each two adjacent first elongated trenches 931, and these unaffected regions form intermediate portions 931b.

Next, the following describes advantageous effects of the package structure A2 according to the second embodiment and the method for forming the same.

The package structure A2 has a roughened area 93' formed on the obverse surface 911 of the metal member 91. The roughened area 93' includes a plurality of first elongated trenches 931. The first elongated trenches 931 are recessed from the obverse surface 911, and the surface of the first elongated trenches 931 is coarsened as compared to the obverse surface 911. In addition, the first elongated trenches 931 are filled up with the resin member 92. Similarly to the first embodiment, this configuration contributes to the anchoring effect of increasing the strength of adhesion between the obverse surface 911 of the metal member 91 and the resin member 92. The package structure A2 is therefore effective prevent peeling of the resin member 92 from the metal member 91. Consequently, the obverse surface 911 of the metal member 91 can be protected from corrosion.

The present inventor conducted a shear test on the package structure A2 in the same manner as the shear test conducted on the package structure A1. The shear test in this embodiment was conducted to measure the shear strength of a sample having the roughened area 93' formed by setting the pitch Dx' of the scan paths SO1 to 66 μm. The test conditions were the same as those of the first embodiment.

The shear test on the roughened area 93' obtained a shear strength of 21.68 kgf in the normal direction, and a shear strength of 22.34 kgf in the parallel direction. Thus, the average of the shear strengths was 22.01 kgf. As described earlier, the metal member 91 not having a roughened area 93 exhibited a shear strength of 5.64 kgf on average (5.47 kgf in the normal direction and 5.81 kgf in the parallel direction). That is, providing the package structure A2 with the roughened area 93' having the first elongated trenches 931 is effective to increase the strength of adhesion between the metal member 91 and the resin member 92.

In order to examine the correlation between the pitch Dx' of the scan paths SO1 and the shear strength, the present inventor additionally prepared a sample having a roughened area 93' formed by setting the pitch Dx' of the scan paths SO1 to 99 μm and conducted a shear test to measure the shear strength. The shear test on this sample obtained a shear strength of 17.29 kgf in the normal direction, and a shear strength of 15.10 kgf in the parallel direction. Thus, the average of the shear strengths was 16.20 kgf. This indicates that even if the pitch Dx' is increased to about 99 μm, the presence of a roughened area is still effective to improve the shear strength of the metal member 91 than not having a roughened area 93. That is, forming a roughened area 93 having first elongated trenches 931 can qualitatively increase the shear strength.

The present inventor also conducted shear tests on samples prepared by setting the pitch Dx' of the scan paths SO1 to about 33 μm (as in the first embodiment) and about 66 μm and about 99 μm, and compared the results of the shear tests. As a result of the comparison, the present inventor have learned that the shear strength tends to increase quantitatively as the pitch Dx" is smaller. This is because the smaller pitch Dx' means that more of the roughened area 93' is occupied by the first elongated trenches 931. This increase in the area occupied by the first elongated trenches 931 will increase the shear strength. That is, the adhesion strength of the package structure A2 can be adjusted by adjusting the pitch Dx' of the laser irradiation pattern (line pattern). Note, however, that the laser beam scanning will take longer as the pitch Dx' is smaller, which lowers the efficiency of producing the package structure. For applications where a high adhesion strength is not required, the pitch Dx' may be set to large. In this way, the production efficiency can be improved without compromising an appropriate level of the adhesion strength.

Next, a package structure according to a third embodiment of the present disclosure will be described with reference to FIGS. 13 to 17. A package structure A3 according to the third embodiment has a roughened area 93", which is different from the roughened areas 93 and 93', on the obverse surface 911 of the metal member 91. As for the overall configuration, the package structure A3 is the same as the package structure A1 shown in FIGS. 1 and 2.

Figure 14:
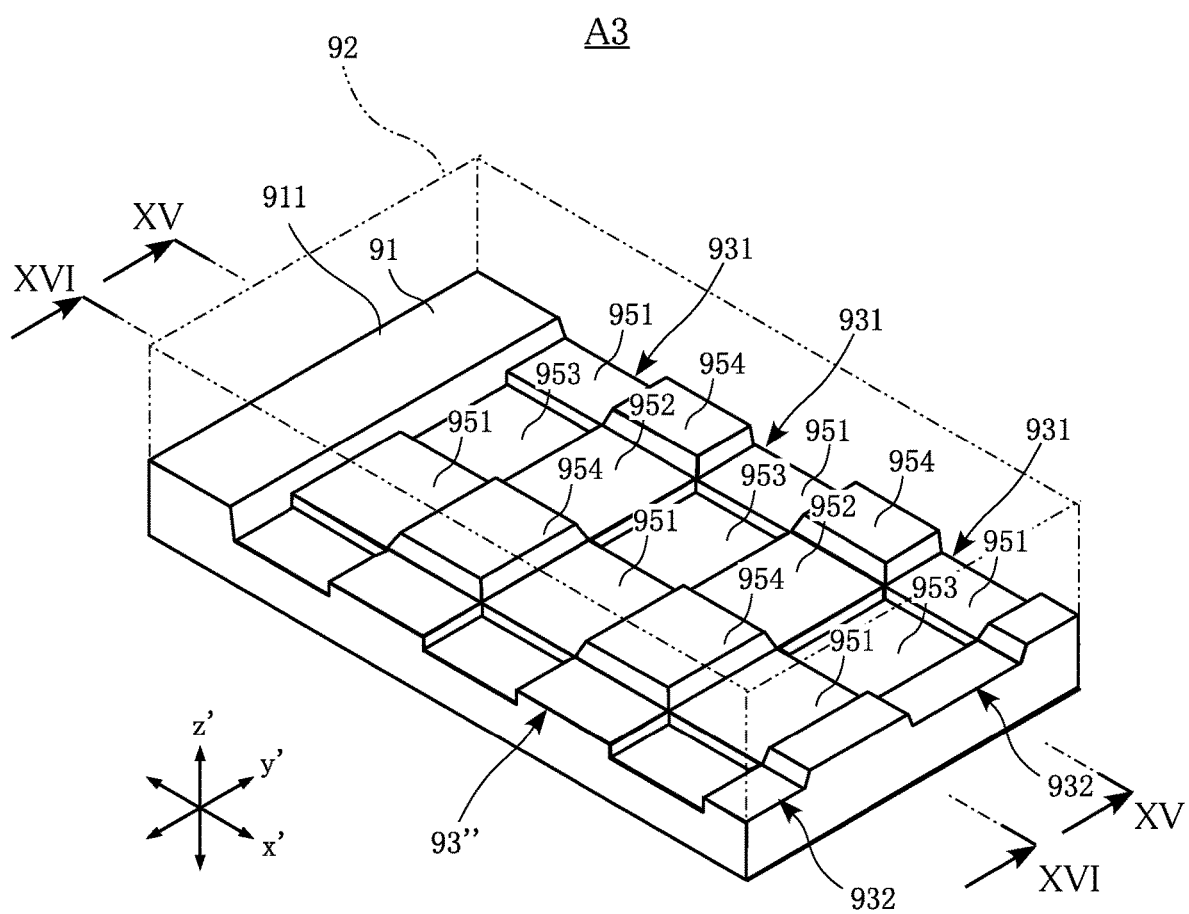
FIG. 14 is a perspective view of the part shown in FIG. 13.

FIGS. 13 to 16 show the roughened area 93". FIG. 13 is an enlarged plan view of the roughened area 93" and corresponds to FIG. 3 associated with the first embodiment. FIG. 14 is a perspective view of the part shown in FIG. 13. FIG. 15 is a sectional view taken along line XV-XV of FIG. 14. FIG. 16 is a sectional view taken along line XVI-XVI of FIG. 14.

As shown in FIGS. 13 to 16, the roughened area 93" includes a plurality of first elongated trenches 931 and a plurality of second elongated trenches 932. That is, the roughened area 93" differs from the roughened areas 93 and 93" in that the second elongated trenches 932 are formed. The first elongated trenches 931 and the second elongated trenches 932 have an oxide layer 94 as a surface layer. The oxide layer 94 of this embodiment is not shown in the figures. In addition, the edges of each first elongated trench 931 and each second elongated trench 932 may or may not be raised in the z' direction.

The second elongated trenches 932 are recessed from the obverse surface 911. The second elongated trenches 932 extend in the x' direction. As viewed in the z' direction, each second elongated trench 932 is continuous from one edge of the roughened area 93" in the x' direction to the other edge. As shown in FIGS. 13 and 14, each second elongated trench 932 as viewed in the z' direction extends linearly. The second elongated trenches 932 are arranged in a predetermined regular pattern. As shown in FIGS. 13 and 14, the second elongated trenches 932 as viewed in the z' direction are equally spaced apart in the y' direction. As shown in FIGS. 13 and 14, each second elongated trench 932 as viewed in the z' direction intersects each first elongated trench 931 at a right angle.

Each first elongated trench 931 in the roughened area 93" has a substantially trapezoidal profile in a section taken along a plane perpendicular to the y' direction (x'–z' plane). More specifically, a shorter edge of the trapezoidal section corresponds to the lower edge in the z' direction and a longer edge to an upper edge in the z' direction. In one example, the x'-direction dimension of each first elongated trench 931 (the width of each first elongated trench 931) is about 10 to 200 µm (about 80 µm in this embodiment), and the distance between each two adjacent first elongated trenches 931 in the x' direction is about 80 µm. Similarly, each second elongated trench 932 has a substantially trapezoidal section along a plane perpendicular to the x' direction (y'–z' plane). More specifically, a shorter edge of the trapezoidal section corresponds to the lower edge in the z' direction and a longer edge to an upper edge in the z' direction. In one example, the y'-direction dimension of each second elongated trench 932 (the width of each second elongated trench 932) is about 10 to 200 µm (about 80 µm in this embodiment), and the distance between each two adjacent second elongated trenches 932 in the y' direction is about 80 µm. The distance between each two adjacent first elongated trenches 931 in the x' direction may or may not be substantially equal to the distance between each two adjacent second elongated trenches 932 in the y' direction. In addition, the width of each first elongated trench 931 may or may not be substantially equal to the width of each second elongated trench 932.

As shown in FIGS. 13 to 16, the roughened area 93" includes a plurality of first bottom surfaces 951, a plurality of second bottom surfaces 952, a plurality of third bottom surfaces 953 and a plurality of flat surfaces 954. The first bottom surfaces 951, the second bottom surfaces 952 and the third bottom surfaces 953 are rough surfaces having fine asperities.

As viewed in the z' direction, each first bottom surface 951 overlaps with a first elongated trench 931 but not with any of the second elongated trenches 932. As viewed in the z' direction, each second bottom surface 952 overlaps with a second elongated trench 932 but not with any of the first elongated trenches 931. As viewed in the z' direction, each third bottom surface 953 overlaps with a first elongated trench 931 and a second elongated trench 932. That is, as viewed in the z' direction, each third bottom surface 953 corresponds to an intersection of a first elongated trench 931 and a second elongated trenches 932. As viewed in the z' direction, the flat surfaces 954 do not overlap with any of the first elongated trenches 931 and the second elongated trenches 932.

The flat surfaces 954 are flush with the obverse surface 911 in the z' direction. The flat surfaces 954 are regions of the roughened area 93" not irradiated with the laser beam in the surface roughening process. The third bottom surfaces 953 are located at a height below the flat surfaces 954 in the z' direction. The first bottom surfaces 951 and the second bottom surfaces 952 are located at a height between the third bottom surfaces 953 and the flat surfaces 954 in the z' direction. In the present embodiment, the first bottom surfaces 951 and the second bottom surfaces 952 are flush with each other. However, the first and second bottom surfaces may be located at different heights in the z' direction.

Next, a method for forming the package structure A3 according to the third embodiment will be described.

The method according to this embodiment is different from the first and second embodiments in the laser irradiation pattern used in the surface roughening process. More specifically, while a line pattern is used as the laser irradiation pattern in the first and second embodiments, this embodiment uses a grid pattern.

Figure 17:
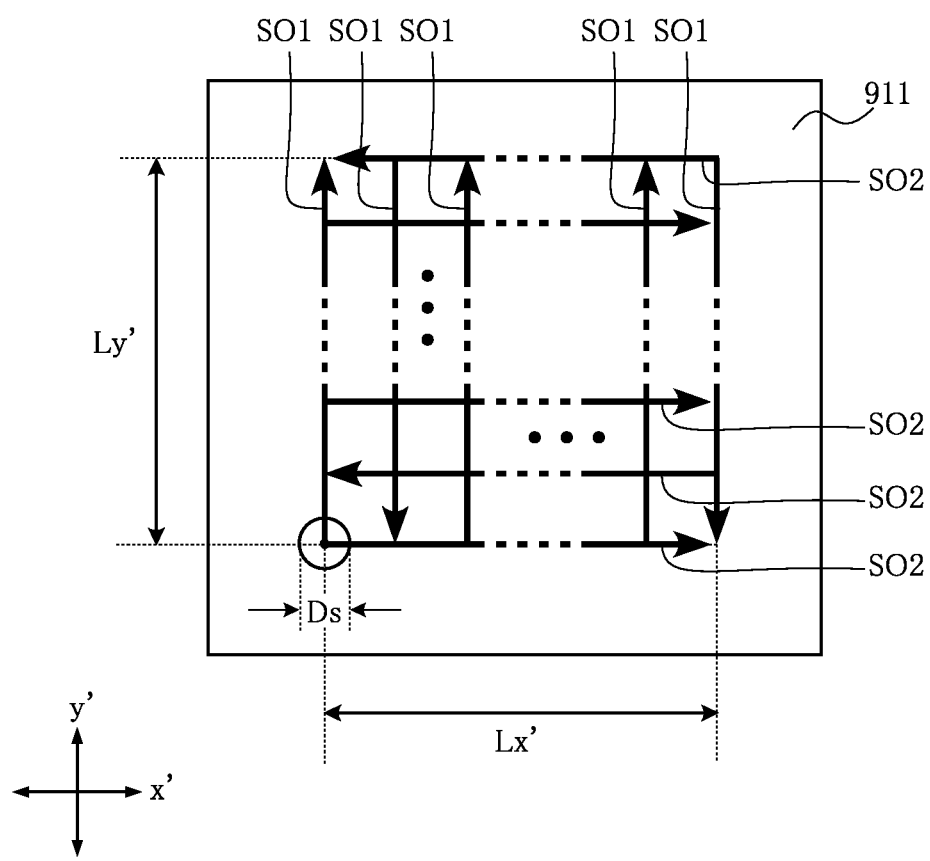
FIG. 17 is a view of a laser irradiation pattern according to the third embodiment.

FIG. 17 shows the laser irradiation pattern used in this embodiment. As shown in FIG. 17, the laser irradiation pattern is composed of a plurality of scan paths SO1 and a plurality of scan paths SO2. The scan paths SO1 extend in the y' direction and equally spaced apart in the x' direction. The scan paths SO2 extend in the x' direction and equally spaced apart in the y' direction. Each of the scan paths SO1 and SO2 defines a straight line. That is, the laser irradiation pattern of this embodiment is composed of linear scanning lines defining a grid pattern. In one example, the distance between each two adjacent scan paths SO1 in the x' direction is equal to the distance between each two adjacent scan paths SO2 in the y' direction. The parameters of the laser scanning, such as the pitch of the scan paths SO1, the pitch of the scan paths SO2 and the spot diameter Ds, may be changed as appropriate according to the roughened area 93" to be formed.

Next, the following describes advantageous effects of the package structure A3 according to the third embodiment and the method for forming the same.

The package structure A3 has a roughened area 93" formed on the obverse surface 911 of the metal member 91. The roughened area 93" includes a plurality of first elongated trenches 931. The first elongated trenches 931 are recessed from the obverse surface 911, and the surface of the first elongated trenches 931 is coarsened as compared to the obverse surface 911. In addition, the first elongated trenches 931 are filled up with the resin member 92. Similarly to the first embodiment, this configuration contributes to the anchoring effect of increasing the strength of adhesion between the obverse surface 911 of the metal member 91 and the resin member 92. The package structure A3 is therefore effective to prevent peeling of the resin member 92 from the metal member 91. Consequently, the obverse surface 911 of the metal member 91 can be protected from corrosion.

The present inventor conducted a shear test on the package structure A3 in the same manner as the shear tests of the package structures A1 and A2. The shear test of this embodiment obtained a shear strength of 24.43 kgf in the normal direction, and a shear strength of 23.43 kgf in the parallel direction. Thus, the average of the shear strengths was 23.93 kgf. That is, the presence of the roughened area 93" increases the shear strength of the package structure A3 as compared with a package structure not having a roughened area 93". Therefore, the package structure A3 is also effective to increase the adhesion strength between the metal member 91 and the resin member 92.

In the package structure A3, the first elongated trenches 931 intersect with the second elongated trenches 932. That is, a continuous space recessed from the obverse surface 911 is defined across the entire roughened area 93". This surface configuration is advantageous in the resin member forming process because a liquid resin injected for forming the resin member 92 is enabled to flow throughout the space by capillary-like action. That is, the liquid resin for forming the resin member 92 is enabled to fill the first elongated trenches 931 and the second elongated trenches 932.

Although the package structure A3 is directed to an example in which the roughened area 93" includes the flat surfaces 954, this is not a limitation. For example, a laser irradiation pattern shown in FIG. 17 may be modified by decreasing the pitch of the scan paths SO1 and SO2. Then, the resulting roughened area 93" will not have the flat surfaces 954 but instead have raised ridges.

In the first through third embodiments, the shear tests were conducted at an ambient temperature of 25° C. The present inventor conducted similar shear tests except that the ambient temperature was set to 150° C. As a result, the package structures A1 to A3 all exhibited shear strengths about 50 to 70% lower than the shear strengths measured in the previous shear tests. By observing the peeling state of the pudding-cup shaped resin members 92 (test pieces), the present inventor found fragments of the resin members 92 left on the roughened areas 93, 93' and 93". This indicates that the resin members 92 exposed to the high-temperature environment underwent a decrease in mechanical strength and ruptured. That is, rupture did not occur at the interface between the metal member 91 and the resin member 92. These results show that the package structures A1 through A3 are also effective to improve the stability of the adhesion between the metal member 91 and the resin member 92 against temperature variation.

The present inventor also examined some other roughened areas having different configurations than the roughened areas 93, 93' and 93". For this purpose, samples were prepared by the surface roughening process using different laser irradiation patterns and conditions, and a shear test was conducted on each sample in the manner described above. Table 1 shows the shear strengths measured on nine samples, along with the laser irradiation patterns and conditions associated with the respective samples. For comparison, Table 1 also shows the result measured on Sample S0, which was prepared without laser beam scanning and thus without a roughened area.

TABLE 1

| Sample No. | S0 | S1 | S2 | S3 | S4 | S5 | S6 | S7 | S8 | S9 |
|---|---|---|---|---|---|---|---|---|---|---|
| Irradiation Pattern | Not Roughened | | Dot Patten | | | | Grid Pattern | | Line Patten | |
| Pitch (μm) | — | 80 | | 160 | 240 | | 80 | | 44 | 33 |
| Depth (μm) | — | 4 | 7 | 10 | 7 | 7 | 4 | 10 | | — |
| Shear Strength (N/mm$^2$) | 21.9 | 9.6 | 21.9 | 25.8 | 14.3 | 12.9 | 30.0 | 33.2 | 22.3 | 37.9 |
| Strength Ratio | — | 0.44 | 1.00 | 1.18 | 0.65 | 0.59 | 1.37 | 1.51 | 1.02 | 1.73 |

Samples S1 through S5 were prepared by using scanning a laser beam in a dot pattern. Therefore, a plurality of dimples were formed in the roughened areas of these samples. The dot pitch was 80 μm for the samples S1 through S3. The laser beam intensity was adjusted to form dimples having a depth of 4 μm for Sample S1, 7 μm for Sample S2, and 10 μm for Sample S3. Samples S6 and S7 were prepared by scanning a laser beam in a grid pattern. The pitch of the pattern used for Samples S6 and S7 was 80 μm. The laser beam intensity was adjusted to form dimples having a depth of 4 μm for Sample S6, and 10 μm for Sample S7. Samples S8 and S9 were prepared by scanning a laser beam in a line pattern. The pitch of the line pattern was 44 μm for Sample S8, and 33 μm for Sample S9. The surface roughening process used for preparing Sample S9 was substantially the same as the process used for forming the roughened area 93 of the package structure A1.

By measuring the shear strengths of the nine samples, the present inventor have learned the following. That is, the roughened area formed by scanning a laser beam in a dot pattern tends to result in a relatively low shear strength (although the shear strength also depends on the conditions of laser scanning). In contrast, the roughened area formed by scanning a laser beam in a line pattern tends to result in a relatively high shear strength. This tendency indicates that the roughened area with elongated trenches contributes to the increased adhesion strength (shear strength). Thus, forming the first elongated trenches 931 in the roughened areas 93, 93' and 93" is effective to improve the adhesion strength of the package structures A1 to A3. In addition, forming the first elongated trenches 931 is more effective to increase the adhesion strength than forming dimples.

Next, a semiconductor device according to the present disclosure will be described with reference to FIGS. 18 to 30. A semiconductor device B1 of the present disclosure includes an insulating substrate 10, a plurality of conductive members 11, a plurality of switching elements 20, two input terminals 31 and 32, an output terminal 33, a pair of gate terminals 34A and 34B, a pair of sensing terminals 35A and 35B, a plurality of dummy terminals 36, a pair of side terminals 37A and 37B, a pair of insulating layers 41A and 41B, a pair of gate layers 42A and 42B, a pair of sensing layers 43A and 43B, a plurality of base portions 44, a plurality of cord-like connecting members 51, a plurality of plate-like connecting members 52 and a sealing resin 60. The plurality of switching elements 20 include a plurality of switching elements 20A and a plurality of switching elements 20B. The semiconductor device B1 is provided with the roughened areas 93 formed in the above-described manner on the conductive members 11, the input terminals 32, the output terminal 33 and the side terminals 37A and 37B. The semiconductor device B1 includes the package structure A1 described above.

Figure 18:
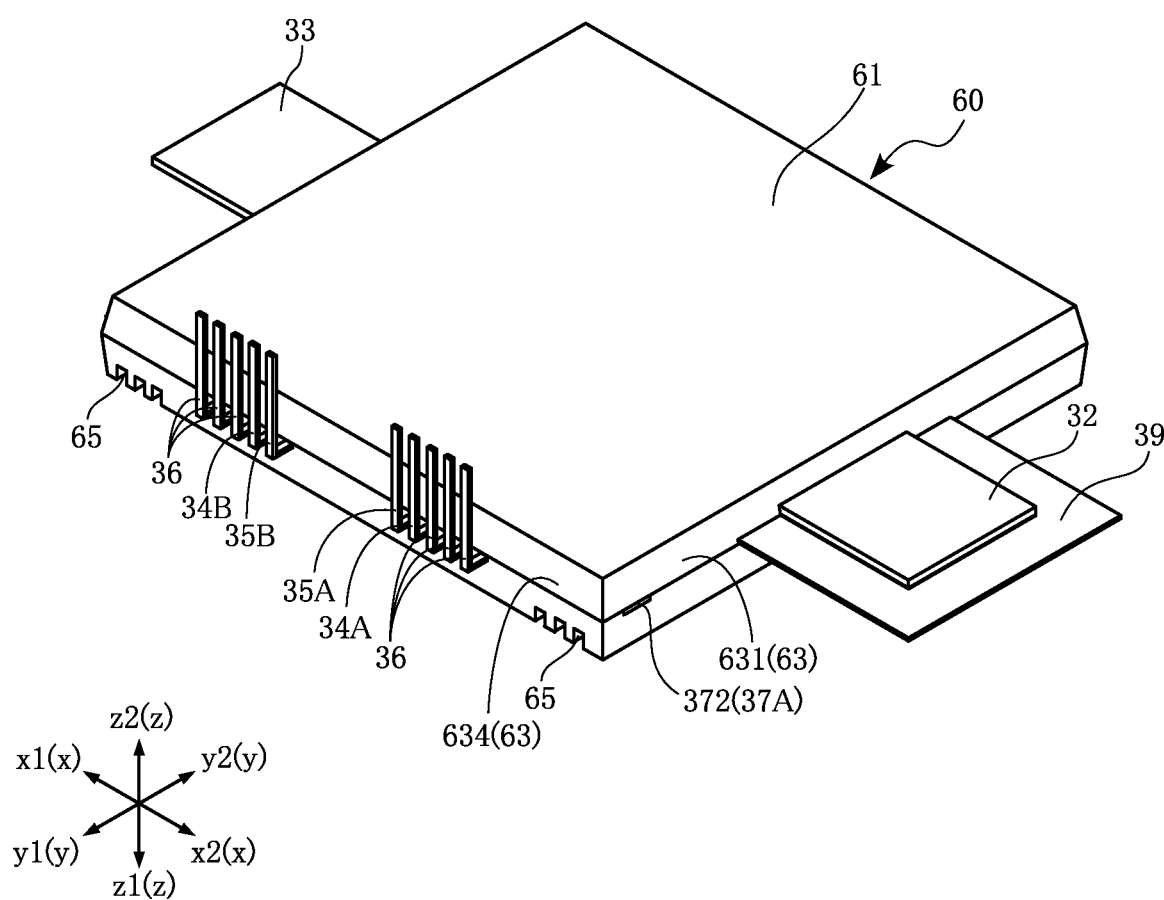
FIG. 18 is a perspective view of a semiconductor device.
Figure 19:
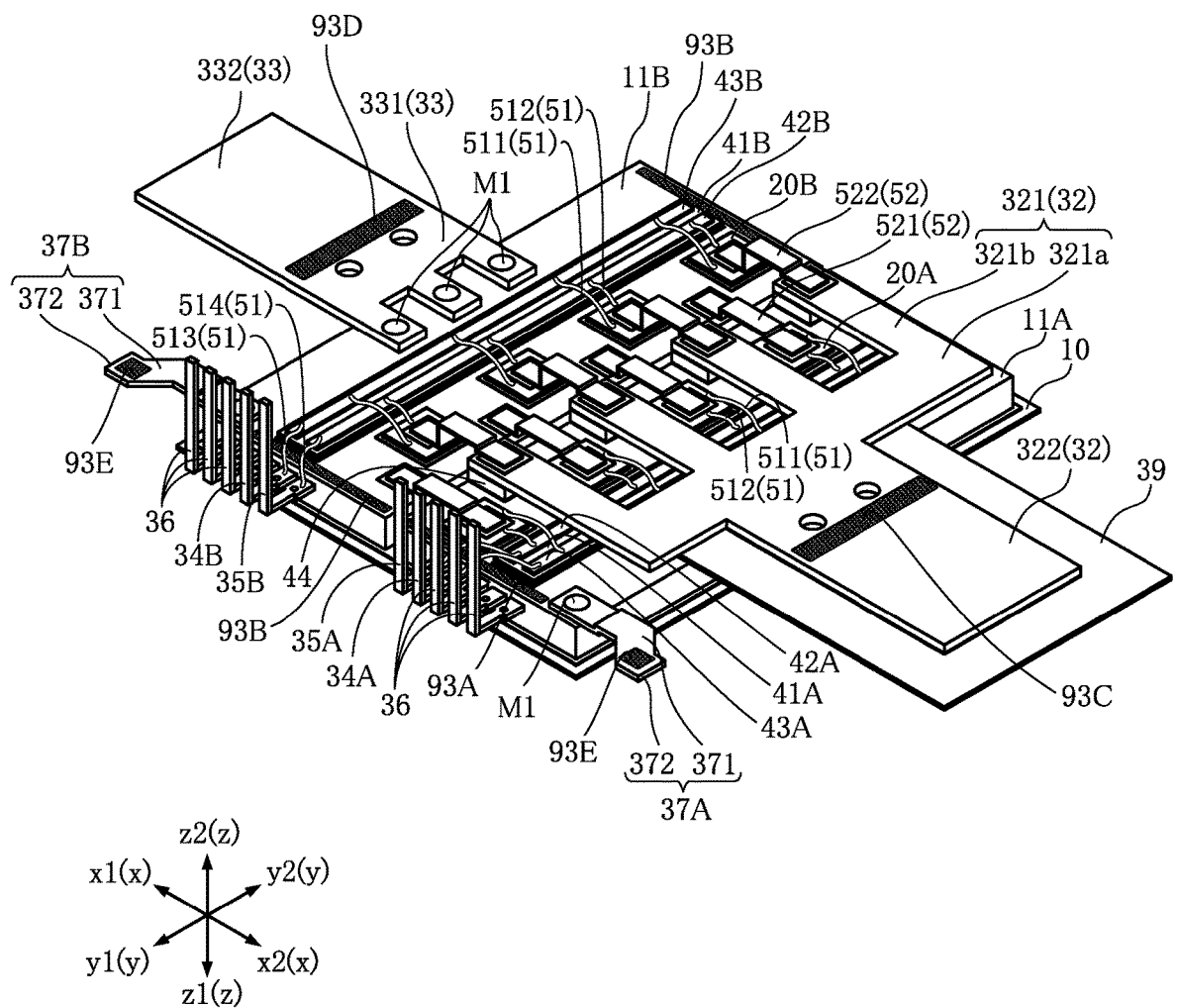
FIG. 19 is a perspective view similar to FIG. 18, but omitting a sealing resin.
Figure 20:
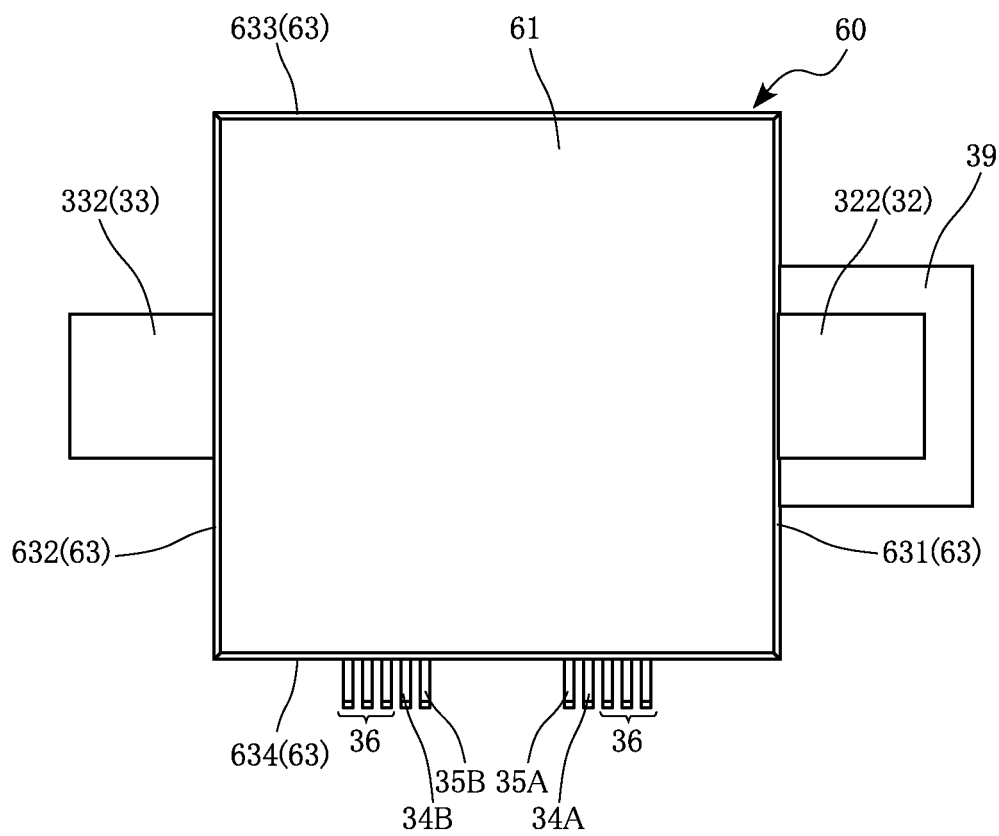
FIG. 20 is a plan view of the semiconductor device.
Figure 21:
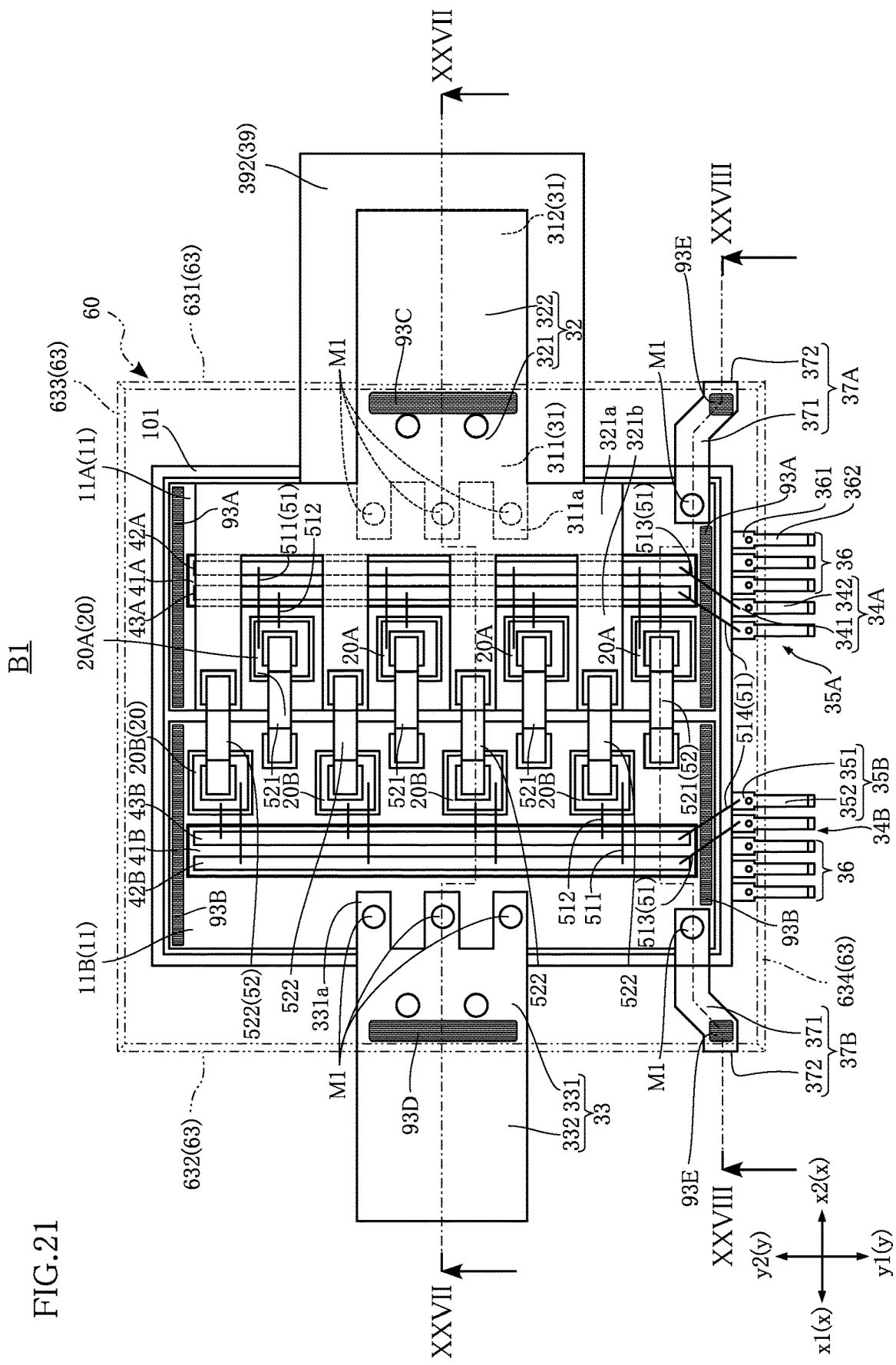
FIG. 21 is a plan view similar to FIG. 20, but showing the sealing resin in phantom.
Figure 22:
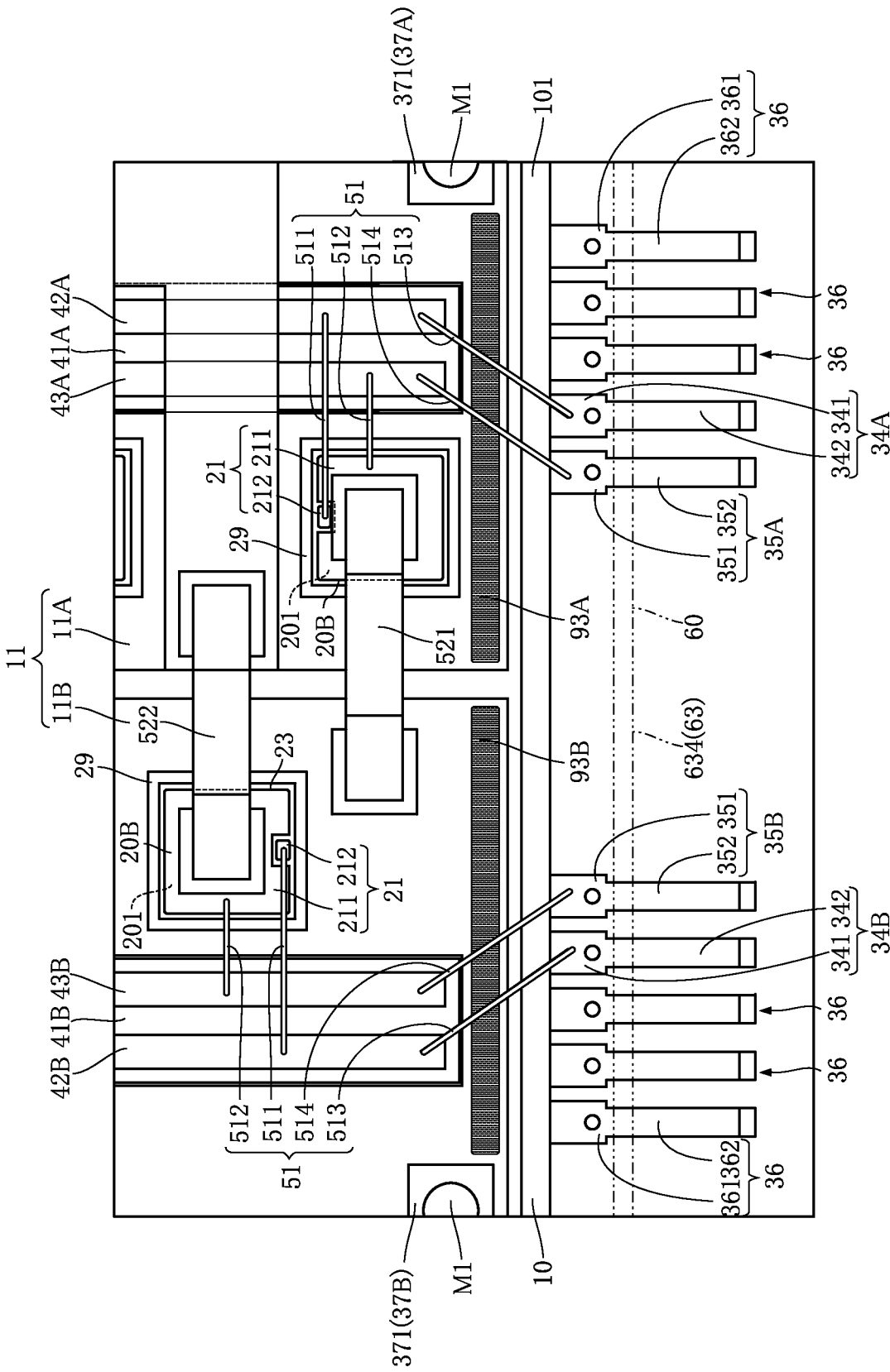
FIG. 22 is an enlarged view showing a part of FIG. 21.
Figure 24:
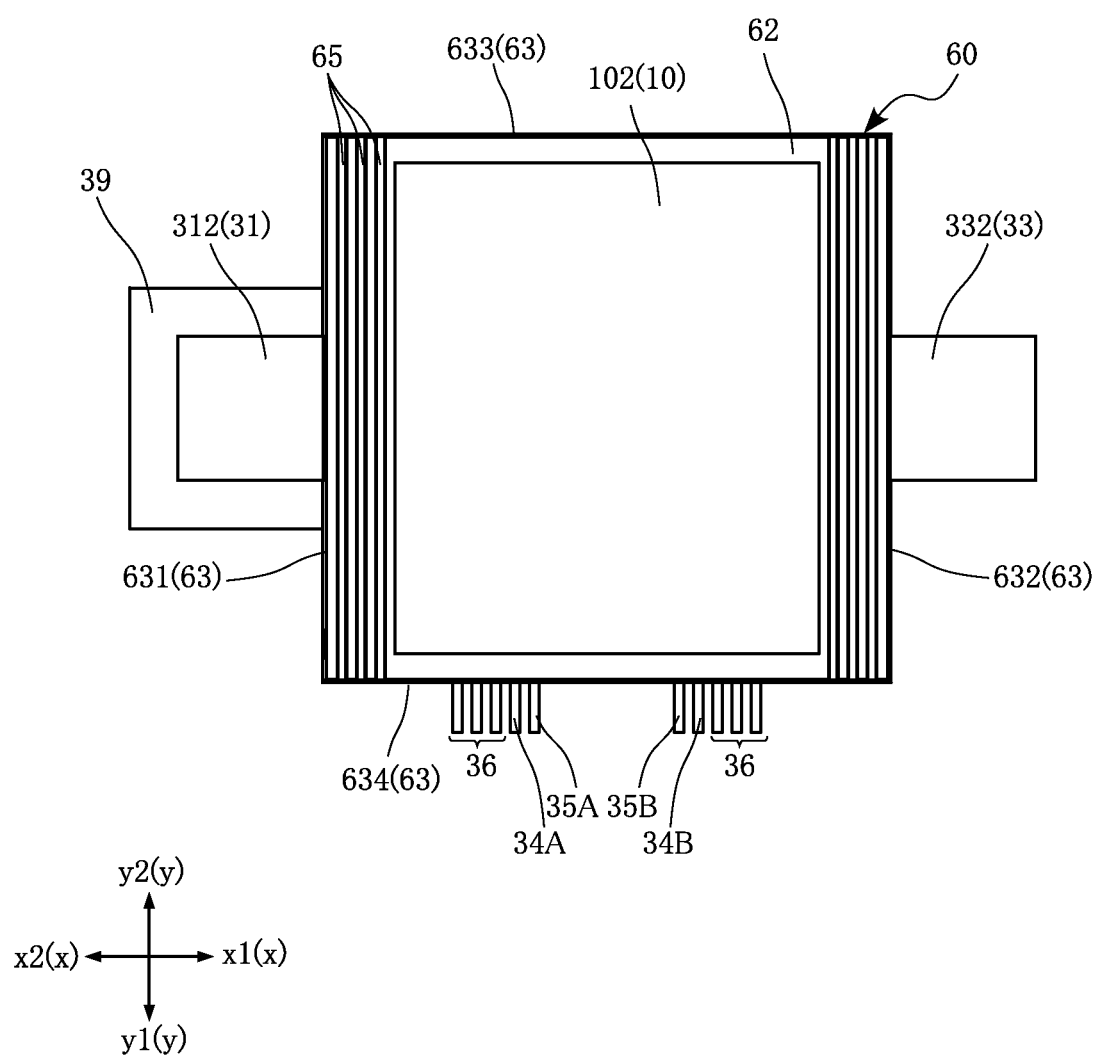
FIG. 24 is a bottom view of the semiconductor device.
Figure 25:
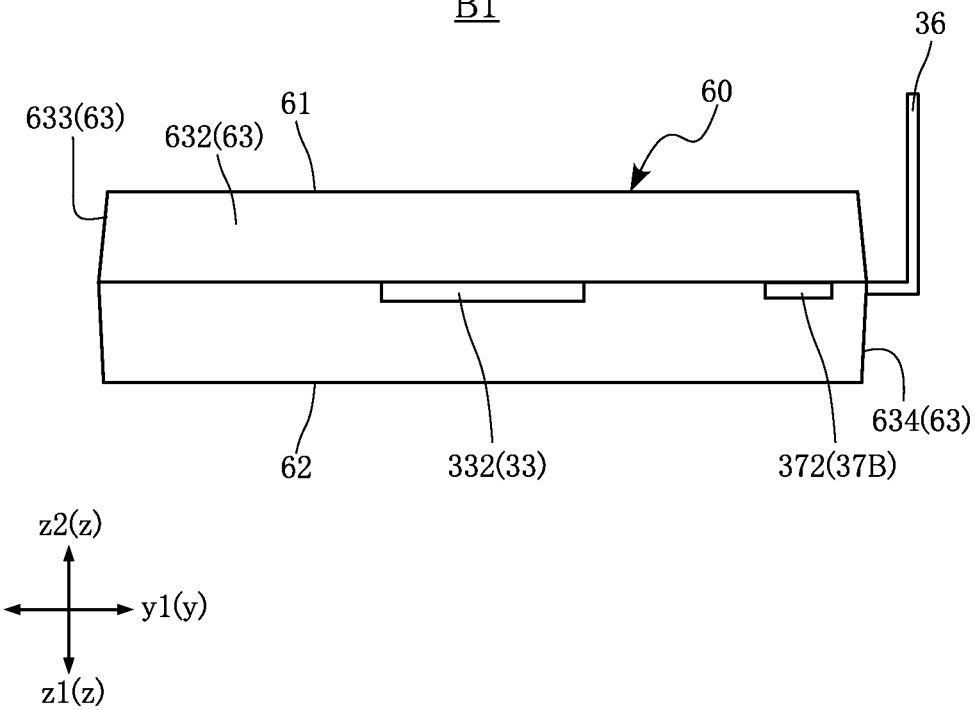
FIG. 25 is a left-side view of the semiconductor device.
Figure 26:
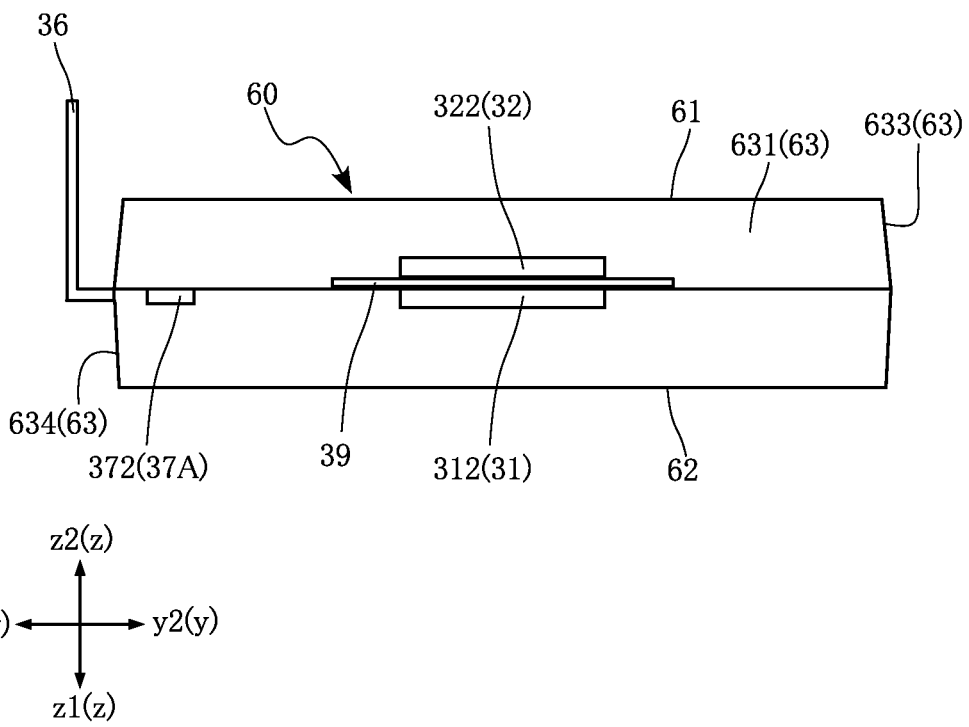
FIG. 26 is a right-side view of the semiconductor device.
Figure 27:
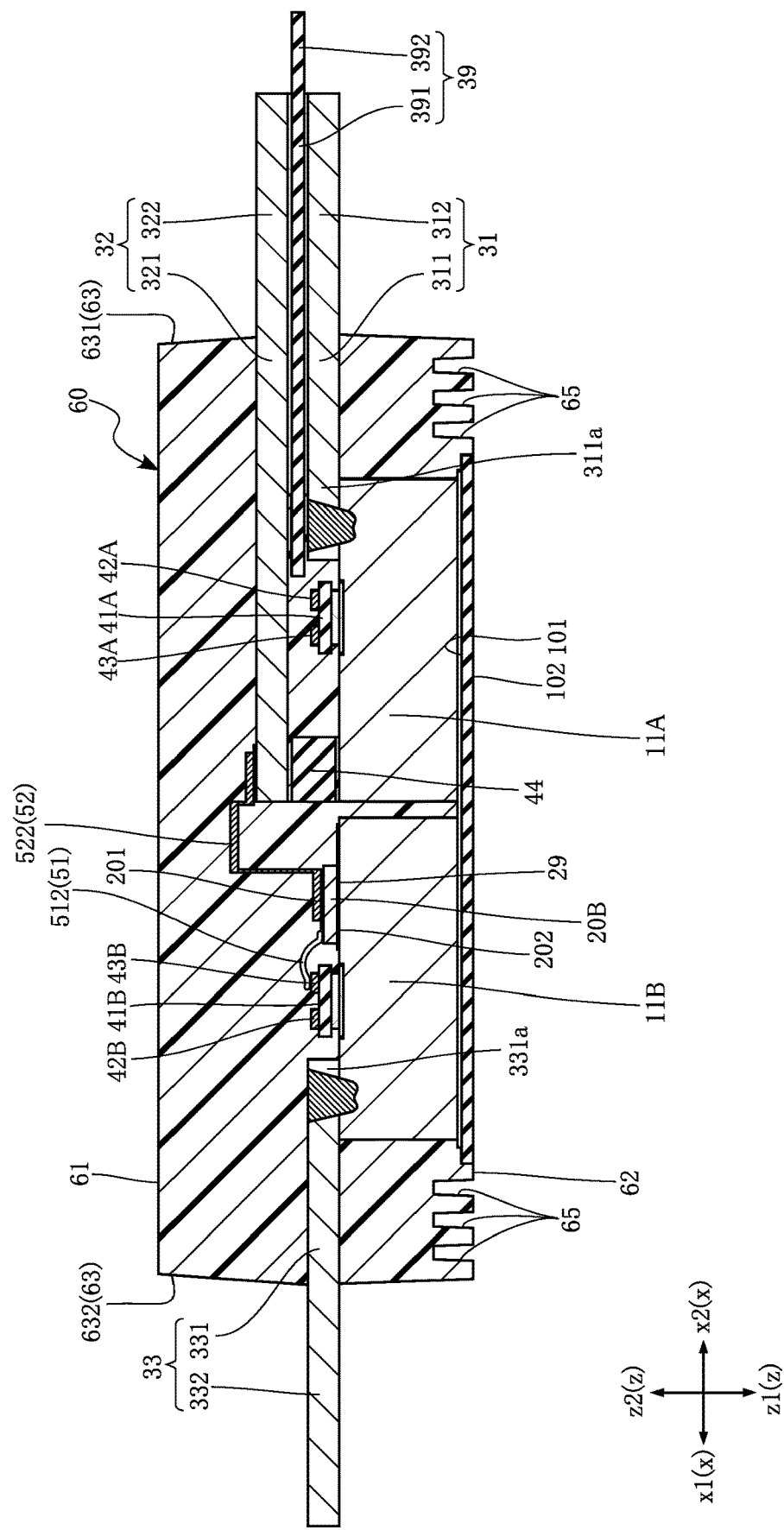
FIG. 27 is a sectional view taken along line XXVII-XXVII of FIG. 21.
Figure 28:
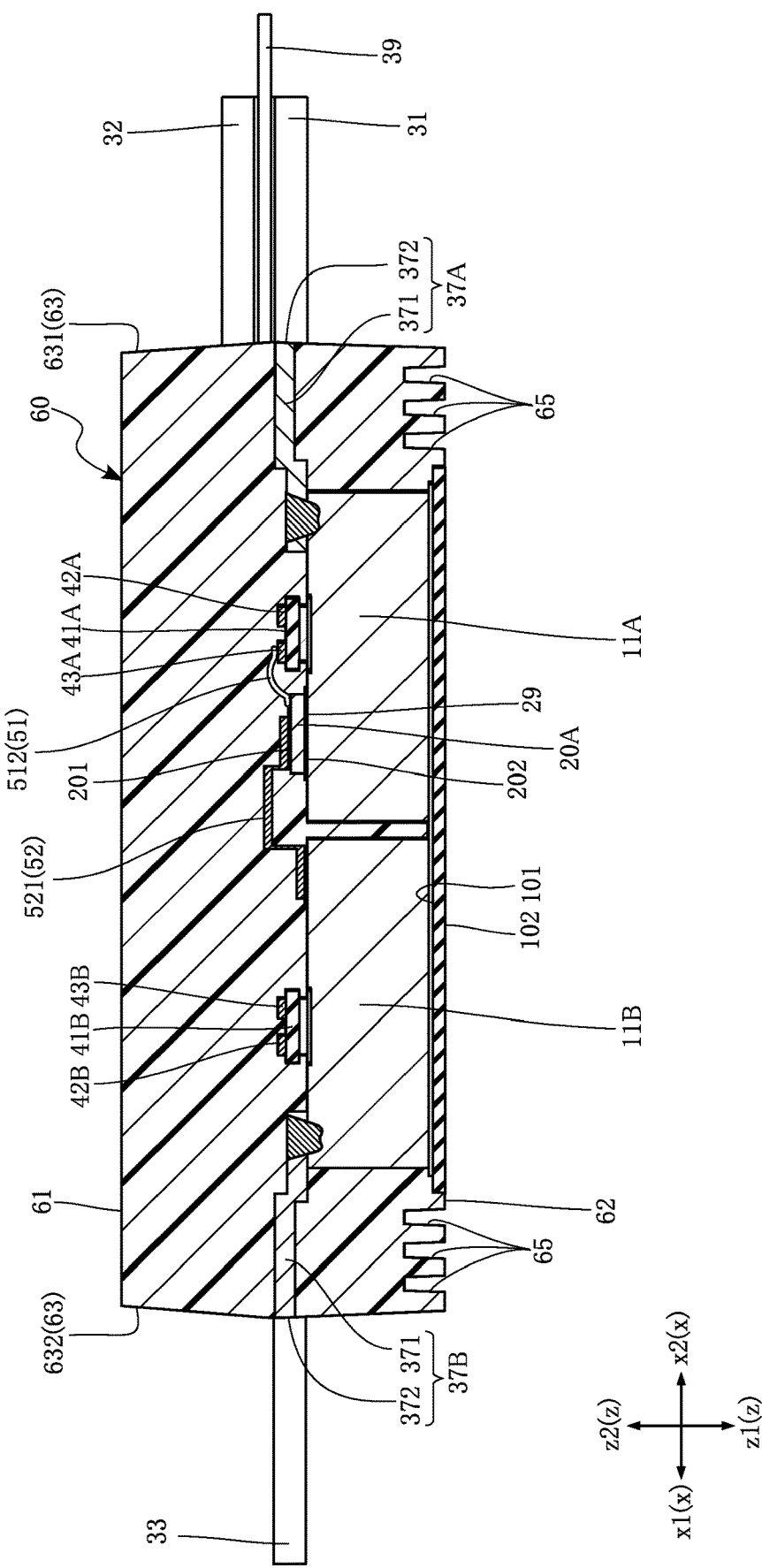
FIG. 28 is a sectional view taken along line XXVIII-XXVIII of FIG. 21.
Figure 29:
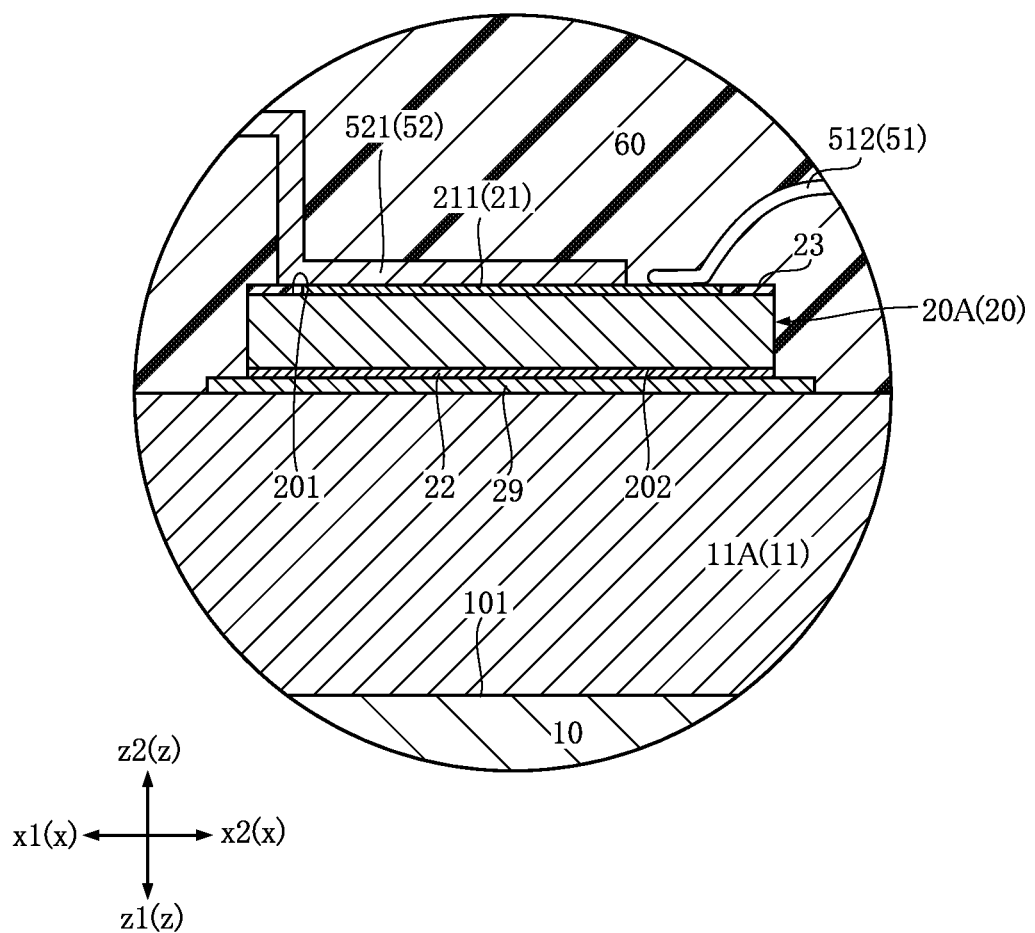
FIG. 29 is an enlarged view showing a part of FIG. 28.

FIG. 18 is a perspective view of the semiconductor device B1. FIG. 19 is a perspective view similar to FIG. 18, but omitting the sealing resin 60. FIG. 20 is a plan view of the semiconductor device B1. FIG. 21 is a plan view similar to FIG. 20, but showing the sealing resin 60 in phantom (in two-dot chain line). FIG. 22 is an enlarged view showing a part of FIG. 21. FIG. 23 is a front view of the semiconductor device B1. FIG. 24 is a bottom view of the semiconductor device B1. FIG. 25 is a left-side view of the semiconductor device B1. FIG. 26 is a right-side view of the semiconductor device B1. FIG. 27 is a sectional view taken along line XXVII-XXVII of FIG. 21. FIG. 28 is a sectional view taken along line XXVII-XXVII of FIG. 21. FIG. 29 is an enlarged view showing a part of FIG. 28, showing the sectional structure of the switching element 20.

For convenience, FIGS. 18 to 29 define three directions perpendicular to each other as x, y and z directions. The z direction is the thickness direction of the semiconductor device B1, and corresponds to the z' direction of the package structure A1. The x direction is the horizontal direction in the plan view of the semiconductor device B1 (see FIGS. 20 and 21). The y direction is the vertical direction in the plan view of the semiconductor device B1 (see FIGS. 20 and 21). As the need arises, one side in the x direction is referred to as x1 direction, and the other side as x2 direction. Similarly, one side in the y direction is referred to as y1 direction, the other side as y2 direction. Also, one side in the z direction is referred to as z1 direction, and the other side as z2 direction. In this embodiment, the x and the y directions respectively correspond to the x' and y' directions of the package structure A1. Note, however, that it is not necessary that the x direction corresponds to the x' direction and the y direction to the y' direction, as long as the z direction corresponds to the z' direction.

As shown in FIGS. 19, 21, 27 and 28, the insulating substrate includes the conductive members 11 arranged thereon. The insulating substrate 10 supports the conductive members 11 and the switching elements 20. The insulating substrate 10 is electrically insulative. The insulating substrate 10 may be made of a ceramic material having a high thermal conductivity. One example of such a ceramic material is AlN (aluminum nitride). In the present embodiment, the insulating substrate 10 is rectangular in plan view. As shown in FIGS. 27 and 28, the insulating substrate 10 has an obverse surface 101 and a reverse surface 102.

The obverse surface 101 and the reverse surface 102 are spaced apart and face away from each other in the z direction. The obverse surface 101 faces in the z2 direction, which is the side in the z direction in which the plurality of conductive members 11 are arranged. The obverse surface 101, as well as the conductive members 11 and the switching elements 20, is covered with the sealing resin 60. The reverse surface 102 faces in the z1 direction. As shown in FIGS. 24, 27 and 28, the reverse surface 102 is exposed from the sealing resin 60. The reverse surface 102 is connected to a heat sink (not shown), for example. The insulating substrate 10 is not limited to the structure described above. For example, a plurality of separate insulating substrates 10 may be provided for the respective conductive members 11.

The conductive members 11 are metal plates. The metal plates are made of Cu or a Cu alloy, for example. The conductive members 11 and the two input terminals 31 and 32 and the output terminal 33 constitute a conductive path to the switching elements 20. The conductive members 11 are arranged on the obverse surface 101 of the insulating substrate 10 and spaced apart from each other. The conductive members 11 are bonded to the obverse surface 101 via a bonding material such as silver (Ag) paste. The dimension of the conductive members 11 in the z direction is 3.0 mm, for example, but it is not limited to this. The conductive members 11 may be coated with Ag plating.

The plurality of conductive members 11 include two conductive members 11A and 11B. As shown in FIGS. 19 and 21, the conductive member 11A is offset further in the x2 direction than the conductive member 11B. The switching elements 20A are mounted on the conductive member 11A. The switching elements 20A are mounted on the conductive member 11B. Each of the conductive members 11A and 11B may be rectangular in plan view. Each of the conductive members 11A and 11B may be formed with a groove in a part of the surface facing in the z2 direction. For example, the conductive member 11A may have a groove extending in the y direction between the plurality of switching elements 20A and the insulating layer 41A (described later) in plan view. Similarly, the conductive member 11B may have a groove extending in the y direction between the plurality of switching elements 20B and the insulating layer 41B (described later) in plan view.

As shown in FIGS. 19 and 21, the conductive members 11A and 11B have the roughened areas 93A and 93B on parts of their surfaces (facing in the z2 direction). In this embodiment, the roughened areas 93A and 93B have the same configuration as the roughened area 93 described above. In another embodiment, however, the roughened areas 93A and 93B may have the same configuration as the roughened area 93' or 93". In this embodiment, the roughened areas 93A are formed in the regions of the upper surface of the conductive member 11A overlapping with edges of the sealing resin 60 in plan view. That is, the roughened areas 93A are formed at the y-direction edges of the upper surface of the conductive members 11A. The roughened areas 93B are formed in the regions of the upper surface of the conductive member 11B overlapping with edges of the sealing resin 60 in plan view. That is, the roughened areas 93B are formed at the y-direction edges of the upper surface of the conductive members 11B. The roughened areas 93A and 93B to be formed are not limited to the example described above. For example, the entire upper surface of each of the conductive members 11A and 11B may be a roughened area.

The structure of the conductive members 11 is not limited to the example described above, and may be modified as appropriate according to the performance required for the semiconductor device B1. For example, the shape, size, arrangement, etc., of each conductive member 11 may be changed based on the number, arrangement, etc., of the switching elements 20.

The switching elements 20 are metal-oxide-semiconductor field-effect transistors (MOSFETs) formed from a semiconductor material, which mainly is silicon carbide (SiC). The switching elements 20 are not limited to MOSFETs, and may be field effect transistors including metal-insulator-semiconductor FETs (MISFETs), bipolar transistors such as insulated gate bipolar transistors (IGBTs), and IC chips such as LSIs. In the present embodiment, all of the switching elements 20 are identical and re-channel MOSFETs. The switching elements 20 may be, but not limited to, rectangular in plan view.

As shown in FIG. 29, each switching element 20 has an element obverse surface 201 and an element reverse surface 202. FIG. 29 shows a switching element 20A. The element obverse surface 201 and the element reverse surface 202 are spaced apart and face away from each other in the z direction. The element obverse surface 201 faces in the same direction as the obverse surface 101 of the insulating substrate 10. The element reverse surface 202 faces the obverse surface 101 of the insulating substrate 10.

As shown in FIG. 29, each switching element 20 has an obverse-surface electrode 21, a reverse-surface electrode 22 and an insulating film 23.

The obverse-surface electrode 21 is provided on the element obverse surface 201. As shown in FIG. 22, the obverse-surface electrode 21 includes a first electrode 211 and a second electrode 212. The first electrode 211 is a source electrode, for example, through which a source current flows. The second electrode 212 is a gate electrode, for example, to which a gate voltage is applied for driving the switching element 20. The first electrode 211 is larger than the second electrode 212. Although the first electrode 211 shown in FIG. 22 is configured to have one continuous area, it may have of a plurality of separate areas.

The reverse-surface electrode 22 is provided on the element reverse surface 202. The reverse-surface electrode 22 may be formed on the entire the element reverse surface 202. The reverse-surface electrode 22 is a drain electrode, for example, through which a drain current flows.

The insulating film 23 is provided on the element obverse surface 201. The insulating film 23 is electrically insulative. The insulating film 23 surrounds the obverse-surface electrode 21 in plan view. For example, the insulating film 23 is formed by stacking a silicon dioxide ($SiO_2$) layer, a silicon nitride ($SiN_4$) layer, and a polybenzoxazole layer in the stated order from the element obverse surface 201. Note that the insulating film 23 may include a polyimide layer instead of the polybenzoxazole layer.

As described above, the switching elements 20 include a plurality of switching elements 20A and a plurality of switching elements 20B. As shown in FIGS. 19 and 21, the semiconductor device B1 includes four switching elements 20A and four switching elements 20B. The number of the switching elements 20 is not limited to the above example, and may be changed as appropriate according to the performance required for the semiconductor device B1. For example, when the semiconductor device B1 a half-bridge switching circuit, the semiconductor device B1 may include a plurality of switching elements 20A constituting an upper arm circuit and a plurality of switching elements 20B constituting a lower arm circuit.

As shown in FIG. 21, the switching elements 20A are mounted on the conductive member 11A. The switching elements 20A are aligned and spaced apart from each other in the y direction. As shown in FIG. 29, each switching element 20A is electrically bonded to the conductive member 11A via a conductive bonding layer 29. The conductive bonding layer 29 may be made of lead-free solder that mainly contains tin (Sn) in one non-limiting example. In another example, it may be made of Ag paste instead. The switching elements 20A are disposed such that their element reverse surfaces 202 face the upper surface (the surface facing in the z2 direction) of the conductive member 11A. The reverse-surface electrodes 22 of each switching element 20A is electrically connected to the conductive member 11A via the conductive bonding layer 29.

As shown in FIG. 21, the switching elements 20B are mounted on the conductive member 11B. The switching elements 20B are aligned and spaced apart from each other in the y direction. Each switching element 20B is electrically bonded to the conductive member 11B via a conductive bonding layer 29. The switching elements 20B are disposed such that their element reverse surfaces 202 face the upper surface (the surface facing in the z2 direction) of the conductive member 11B. The reverse-surface electrodes 22 of each switching element 20B is electrically connected to the conductive member 11B via the conductive bonding layer 29.

Each of the two input terminals 31 and 32 is a metal plate. The metal plates are made of Cu or a Cu alloy, for example. The dimension of each of the two input terminals 31 and 32 in the z direction is 0.8 mm, for example, but it is not limited to this. As shown in FIG. 21, each of the two input terminals 31 and 32 is arranged at a position offset in the x2 direction in the semiconductor device B1. A source voltage, for example, is applied across the two input terminals 31 and 32. The source voltage may be applied to the input terminals 31 and 32 directly from a power source (not shown) or via a bus bar (not shown) connected to sandwich the input terminals 31 and 32. In addition, a snubber circuit may be connected in parallel. The input terminal 31 is a positive electrode (P terminal), and the input terminal 32 is a negative electrode (N terminal). The input terminal 32 is spaced apart from both of the input terminal 31 and the conductive member 11A in the z direction.

As shown in FIGS. 21 and 27, the input terminal 31 has a pad portion 311 and a terminal portion 312.

The pad portion 311 is a part of the input terminal 31 covered with the sealing resin 60. The end of the pad portion 311 in the x1 direction has a comb-like shape, and includes a plurality of prongs 311a. The prongs 311a are electrically bonded to the surface of the conductive member 11A. The bonding may be done by laser welding using a laser beam or ultrasonic welding, or via a conductive bonding material. In this embodiment, the prongs 311a are bonded to the conductive member 11A by laser welding and have weld marks M1, which are visible in plan view (see FIG. 30).

Figure 30:
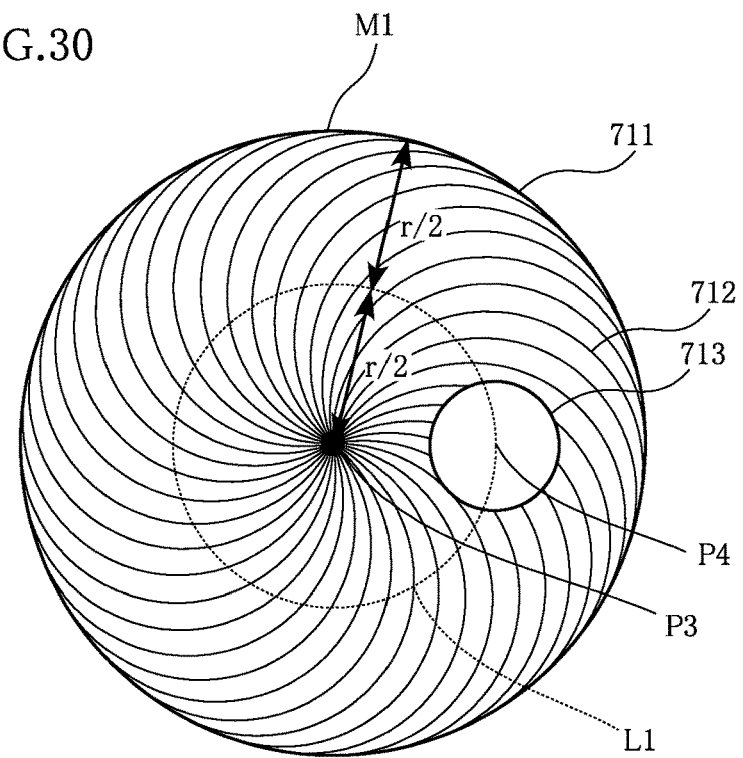
FIG. 30 is a plan view showing an example of a weld mark.

FIG. 30 shows an example of a weld mark M1. The weld mark M1 may be any weld mark formed as a result of laser welding, and the shape and other details of the mark are not limited to the example shown in the figure. The weld mark M1 shown in FIG. 30 has a circumferential edge 711, a plurality of streaks 712 and a crater 713.

The circumferential edge 711 defines the boundary of the weld mark M1. In plan view, the circumferential edge 711 of this embodiment defines an annular shape having the center on a reference point P3. Although the circumferential edge 711 shown in FIG. 30 defines a perfectly circular annular shape, some distortions and irregularities may be included.

As shown in FIG. 30, each streak 712 has the shape of an arc in plan view. In particular, all the streaks 712 start from the reference point P3 set on the center of the circumferential edge 711, extend outward in a curve projecting in one annular direction along the circumferential edge 711, and terminate on the circumferential edge 711. In the present embodiment, the circumferential edge 711 is circular in plan view, so that the annular directions refer to the circumferential directions of the circle. In the example shown in FIG. 30, the streaks 712 define curved lines projecting in a counterclockwise direction circumferentially of the circumferential edge 711.

The crater 713 is circular in plan view. In plan view, the crater 713 has a smaller radius than the circumferential edge 711. In plan view, the center P4 of the crater 713 falls on a midpoint of a line segment connecting the center of the circumferential edge 711 (reference point P3) to the circumferential edge 711. FIG. 30 shows by an auxiliary line L1 a circle containing the midpoints of such line segments.

The terminal portion 312 is a part of the input terminal 31 exposed from the sealing resin 60. As shown in FIGS. 21 and 27, the terminal portion 312 extends from the sealing resin 60 in the x2 direction in plan view.

As shown in FIGS. 21 and 28, the input terminal 32 has a pad portion 321 and a terminal portion 322.

The pad portion 321 is a part of the input terminal 32 covered with the sealing resin 60. The pad portion 321 includes a connecting portion 321a and a plurality of extended portions 321b. The connecting portion 321a has a band shape extending in the y direction. The connecting portion 321a is connected to the terminal portion 322. The plurality of extended portions 321b have a band shape extending from the connecting portion 321a in the x1 direction. The extended portions 321b are aligned and spaced apart from each other in the y direction in plan view. Each extended portion 321b has the surface facing in the z1 direction in contact with a corresponding one of the base portions 44 and is supported on the conductive member 11A via the base portion 44.

The pad portion 321 has a roughened area 93c on a part of its surface. In this embodiment, the roughened area 93C has the same configuration as the roughened area 93. In another embodiment, however, the roughened area 93C may have the same configuration as the roughened area 93' or the roughened area 93". The roughened area 93C of this embodiment is formed in the region of the input terminal 32 that overlaps with an edge of the sealing resin 60 in plan view. That is, the roughened area 93C is formed at the edge of the pad portion 321 connected to the terminal portion 322. The roughened area 93C to be formed is not limited to the example described above. For example, the entire upper surface of the pad portion 321 may be a roughened area.

The terminal portion 322 is a part of the input terminal 32 exposed from the sealing resin 60. As shown in FIGS. 21 and 27, the terminal portion 322 extends from the sealing resin 60 in the x2 direction in plan view. The terminal portion 322 is rectangular in plan view. As shown in FIGS. 21 and 27, the terminal portion 322 overlaps with the terminal portion 312 of the input terminal 31 in plan view. The terminal portion 322 is spaced apart from the terminal portion 312 in the z2 direction. The terminal portion 322 may have the same shape as the terminal portion 312.

The output terminal 33 is a metal plate. The metal plate is made of Cu or a Cu alloy, for example. As shown in FIG. 23, the output terminal 33 is arranged at a position offset in the x1 direction in the semiconductor device B1. The output terminal 33 outputs AC power (voltage) converted by the switching elements 20.

As shown in FIGS. 21 and 27, the output terminal 33 has a pad portion 331 and a terminal portion 332.

The pad portion 331 is a part of the output terminal 33 covered with the sealing resin 60. The end of the pad portion 331 in the x2 direction has a comb-like shape, and includes a plurality of prongs 331a. The prongs 331a are electrically bonded to the surface of the conductive member 11B. The bonding may be done by laser welding using a laser beam or ultrasonic welding, or via a conductive bonding material. In this embodiment, the prongs 331a are bonded to the conductive member 11B by laser welding and have weld marks M1, which are visible in plan view (see FIG. 30).

The pad portion 331 has a roughened area 93D on a part of its surface. In this embodiment, the roughened area 93D has the same configuration as the roughened area 93. In another embodiment, however, the roughened area 93D may have same configuration as the roughened area 93' or the roughened area 93". The roughened area 93D of this embodiment is formed in the region of the output terminal 33 that overlaps with an edge of the sealing resin 60 in plan view. That is, the roughened area 93D is formed at the edge of the pad portion 331 connected to the terminal portion 332. The roughened area 93D to be formed is not limited to the example described above. For example, the entire upper surface of the pad portion 331 may be a roughened area.

The terminal portion 332 is a part of the output terminal 33 exposed from the sealing resin 60. As shown in FIGS. 21 and 27, the terminal portion 332 extends from the sealing resin 60 in the x1 direction.

As shown in FIGS. 20 to 22 and 24, the gate terminals 34A and 34B are respectively adjacent to the conductive members 11A and 11B in the y direction. The gate terminal 34A is used to apply a gate voltage for driving the switching elements 20A. The gate terminal 34B is used to apply a gate voltage for driving the switching elements 20B.

As shown in FIGS. 21 and 22, each of the gate terminals 34A and 34B has a pad portion 341 and a terminal portion 342. The pad portions 341 of the gate terminals 34A and 34B are covered with the sealing resin 60. As such, the gate terminals 34A and 34B are supported by the sealing resin 60. The pad portions 341 may be coated with Ag plating. The terminal portions 342 are connected to the respective pad portions 341 and exposed from the sealing resin 60. Each terminal portions 342 has an L-shape as viewed in the x direction.

As shown in FIGS. 20 to 23 and 24, the sensing terminals 35A and 35B are respectively adjacent to the gate terminals 34A and 34B in the x direction. The sensing terminal 35A detects voltage applied to the obverse-surface electrodes 21 (the first electrodes 211) of the switching elements 20A (i.e., voltage corresponding to the source current). The sensing terminal 35B detects voltage applied to the obverse-surface electrodes 21 (the first electrodes 211) of the switching elements 20B (i.e., voltage corresponding to the source current).

As shown in FIGS. 21 and 22, each of the sensing terminals 35A and 35B has a pad portion 351 and a terminal portion 352. The pad portions 351 of the sensing terminals 35A and 35B are covered with the sealing resin 60. As such, the sensing terminals 35A and 35B are supported by the sealing resin 60. The pad portions 351 may be coated with Ag plating. The terminal portions 352 are connected to the respective pad portions 351 and exposed from the sealing resin 60. Each terminal portion 352 has an L-shape as viewed in the x direction.

As shown in FIGS. 20 to 22 and 24, the dummy terminals 36 include those located at the side of the gate terminal 34A opposite from the sensing terminal 35A in the x direction, and those located at the side of the gate terminal 34B opposite from the sensing terminal 35B in the x direction. In the present embodiment, six dummy terminals 36 are provided. Three of the six dummy terminals 36 are positioned offset in one side of the x direction (x2 direction). The other three dummy terminals 36 are positioned offset in the other side of the x direction (x1 direction). The number of the dummy terminals 36 is not limited to six as in the example above. In an alternative example, the dummy terminals 36 may be omitted.

As shown in FIGS. 21 and 22, each dummy terminal 36 has a pad portion 361 and a terminal portion 362. The pad portions 361 of the respective dummy terminals 36 are covered with the sealing resin 60. As such, the dummy terminals 36 are supported by the sealing resin 60. The pad portions 361 may be coated with Ag plating. The terminal portions 362 are connected to the respective pad portions 361 and exposed from the sealing resin 60. Each terminal portions 362 has an L-shape as viewed in the x direction. In the example shown in FIGS. 18 to 26, the terminal portions 362 have the same shape as the terminal portions 342 of the gate terminals 34A and 34B and the terminal portions 352 of the sensing terminals 35A and 35B.

As shown in FIGS. 19, 21 and 28, in plan view, each of the side terminals 37A and 37B is disposed in a region where the edge of the sealing resin 60 in the y1 direction meets one edge of the sealing resin 60 in the x direction. As shown in FIGS. 19 and 21, each of the side terminals 37A and 37B has a pad portion 371 and an end face 372.

The pad portions 371 of the side terminals 37A and 37B are covered with the sealing resin 60. As shown in FIG. 21, the pad portion 371 of each of the side terminals 37A and 37B has a bent portion in plan view. As shown in FIG. 28, each pad portion 371 also has another bent portion, which is bent in the z direction. The pad portion 371 of the side terminal 37A is electrically bonded to the conductive member 11A, and the pad portion 371 of the side terminal 37B is electrically bonded the conductive member 11B. As such, the side terminal 37A is supported by the conductive member 11A, and the side terminal 37B is supported by the conductive member 11B. The pad portions 371 may be bonded by laser welding using a laser beam or ultrasonic welding, or via a conductive bonding material. In the present embodiment, the pad portions 371 of the side terminals 37A and 37B are respectively bonded to the conductive members 11A and 11B by laser welding. As a result, each pad portion 371 has a weld mark M1 (see FIG. 30), which is visible in plan view.

Each pad portion 371 has a roughened area 93E on a part of its surface. The roughened areas 93E may have the same configuration as the roughened area 93 described above as in this example. In another example, however, the roughened area 93E may have the same configuration as the roughened area 93' or 93". In each of the side terminals 37A and 37B, the roughened area 93E is formed in a region overlapping with an edge of the sealing resin 60. That is, each roughened area 93E is formed at the edge of the pad portion 371 connected to the end face 372. The roughened areas 93E to be formed are not limited to the example described above. For example, the entire upper surface of each of the side terminal 37A and 37B may be a roughened area.

The end face 372 of each of the side terminals 37A and 37B is exposed on the sealing resin 60. The end face 372 of the side terminal 37A faces in the x2 direction. The end face 372 of the side terminal 37A may or may not be substantially flush with a resin side surface 631. The end face 372 of the side terminal 37B faces in the x1 direction. The end face 372 of the side terminal 37B may or may not be substantially flush with a resin side surface 632. The side terminals 37A and 37B entirely overlap with the sealing resin 60 in plan view.

The side terminals 37A and 37B are not limited to the structure described above. For example, the side terminals 37A and 37B may respectively extend out of the resin side surfaces 631 and 632 in plan view. Also, the semiconductor device B1 may not include the side terminals 37A and 37B.

As shown in FIGS. 20 to 22, the gate terminals 34A and 34B, the sensing terminals 35A and 35B and the dummy terminals 36 are arranged next to each other in the x direction in plan view. During the manufacture of the semiconductor device B1, the gate terminals 34A and 34B, the sensing terminals 35A and 35B, the dummy terminals 36, and the side terminals 37A and 37B are all formed from the same lead frame.

The insulating member 39 is electrically insulative and may be made of an insulating sheet, for example. As shown in FIG. 28, a part of the insulating member 39 is a flat plate sandwiched between the terminal portion 312 of the input terminal 31 and the terminal portion 322 of the input terminal 32 in the z direction. In plan view, the entire input terminal 31 overlaps with the insulating member 39. As for the input terminal 32, a part of the pad portion 321 and the entire terminal portion 322 overlap with the insulating member 39 in plan view. The insulating member 39 insulates the two input terminals 31 and 32 from each other. The insulating member 39 has a part (which is offset in the x1 direction) covered with the sealing resin 60.

As shown in FIG. 28, the insulating member 39 has an intervening portion 391 and an extended portion 392. The intervening portion 391 is interposed between the terminal portion 312 of the input terminal 31 and the terminal portion 322 of the input terminal 32 in the z direction. The entire intervening portion 391 is sandwiched between the terminal portion 312 and the terminal portion 322. The extended portion 392 extends from the intervening portion 391 in the x2 direction beyond the terminal portion 312 and the terminal portion 322.

The insulating layers 41A and 41B are electrically insulative, and are made of a glass epoxy resin, for example. As shown in FIGS. 19 and 21, each of the insulating layers 41A and 41B is in a band shape elongated in the y direction. As shown in FIGS. 21, 22, 27 and 28, the insulating layer 41A is bonded to the upper surface (the surface facing in the z2 direction) of the conductive member 11A. The insulating layer 41A is offset further in the x2 direction than the switching elements 20A. As shown in FIGS. 21, 22, 27 and 28, the insulating layer 41B is bonded to the upper surface (the surface facing in the z2 direction) of the conductive member 11B. The insulating layer 41B is offset further in the x1 direction than the switching elements 20B.

The gate layers 42A and 42B are electrically conductive, and are made of Cu, for example. As shown in FIG. 21, each of the gate layers 42A and 42B has a band shape elongated in the y direction. As shown in FIGS. 21, 22, 27 and 28, the gate layer 42A is disposed on the insulating layer 41A. The gate layer 42A is electrically connected to the second electrodes 212 (gate electrodes) of the respective switching elements 20A via the cord-like connecting members 51 (specifically, gate wires 511 described later). As shown in FIGS. 21, 22, 27 and 28, the gate layer 42B is disposed on the insulating layer 41B. The gate layer 42B is electrically connected to the second electrodes 212 (gate electrodes) of the respective switching elements 20B via the cord-like connecting members 51 (specifically, gate wires 511 described later).

The sensing layers 43A and 43B are electrically conductive, and are made of Cu, for example. As shown in the figures, each of the sensing layers 43A and 43B has a band shape elongated in the y direction. As shown in FIGS. 21, 22, 27 and 28, the sensing layer 43A is disposed on the insulating layer 41A, along with the gate layer 42A. On the insulating layer 41A, the sensing layer 43A extends side by side with the gate layer 42A in spaced relation from the gate layer 42A. In this example, the sensing layer 43A is located at the side of the gate layer 42A closer to the switching elements 20A (in the x2 direction). Alternatively, however, the sensing layer 43A may be located at the other side. The sensing layer 43A is electrically connected to the first electrodes 211 (source electrodes) of the respective switching elements 20A via the cord-like connecting members 51 (specifically, detection wires 512 described later). As shown in FIGS. 21, 22, 27 and 28, the sensing layer 43B is disposed on the insulating layer 41B, along with the gate layer 42B. On the insulating layer 41B, the sensing layer 43B extends side by side with the gate layer 42B in spaced relation from the gate layer 42B. In this example, the sensing layer 43B is located at the side of the gate layer 42B closer to the switching elements 20A (in the x2 direction). Alternatively, however, the sensing layer 43B may be located at the other side. The sensing layer 43B is electrically connected to the first electrodes 211 (source electrodes) of the respective switching elements 20B via the cord-like connecting members 51 (specifically, detection wires 512 described later).

The base portions 44 are electrically insulative, and are made of a ceramic material, for example. As shown in FIGS. 19 and 27, the base portions 44 are bonded to the surface of the conductive member 11A. The base portions 44 are rectangular in plan view, for example. The base portions 44 are aligned and spaced apart from each other in the y direction. Each base portion 44 has a z-direction dimension that is substantially equal to the total of the z-direction dimension of the input terminal 31 and the z-direction dimension of the insulating member 39. The base portions 44 are bonded to the input terminal 32 at the respective extended portions 321b of the pad portion 321. The base portions 44 support the input terminal 32.

The cord-like connecting members 51 are bonding wires. The cord-like connecting members 51 are electrically conductive, and are made of any one of aluminum (Al), gold (Au) and Cu, for example. As shown in the figures, the cord-like connecting members 51 include a plurality of gate wires 511, a plurality of sensing wires 512, a pair of first connecting wires 513, and a pair of second connecting wires 514.

As shown in FIGS. 21 and 22, each gate wire 511 is bonded at one end to the second electrode 212 (gate electrode) of the corresponding switching element 20, and the other end to the gate layer 42A or 42B. The gate wires 511 include those electrically connecting the second electrodes 212 of the switching elements 20A to the gate layer 42A, and those electrically connecting the second electrodes 212 of the switching elements 20B to the gate layer 42B.

As shown in FIGS. 21 and 22, each sensing wire 512 is bonded at one end to the first electrode 211 (source electrode) of the corresponding switching element 20, and the other end to the sensing layer 43A or 43B. The sensing wires 512 include those electrically connecting the first electrodes 211 of the switching elements 20A to the sensing layer 43A, and those electrically connecting the first electrodes 211 of the switching elements 20B to the sensing layer 43B.

As shown in FIGS. 21 and 22, one of the first connecting wires 513 connects the gate layer 42A and the gate terminal 34A, and the other connects the gate layer 42B and the gate terminal 34B. More specifically, one of the first connecting wires 513 is bonded at one end to the gate layer 42A and the other end to the pad portion 341 of the gate terminal 34A, thereby electrically connecting the gate layer 42A and the gate terminal 34A. The other first connecting wire 513 is bonded at one end to the gate layer 42B and at the other end to the pad portion 341 of the gate terminal 34B, thereby electrically connection the gate layer 42B and the gate terminal 34B.

As shown in FIGS. 21 and 22, one of the second connecting wires 514 connects the sensing layer 43A and the sensing termina 35A, and the other connects the sensing layer 43B and the sensing terminal 35B. More specifically, one of the second connecting wires 514 is bonded at one end to the sensing layer 43A and the other end to the pad portion 351 of the sensing termina 35A, thereby electrically connecting the sensing layer 43A and the sensing terminal 35A. The other second connecting wire 514 is bonded at one end to the sensing layer 43B and the other end to the pad portion 351 of the sensing termina 35B, thereby electrically connecting the sensing layer 43A and the sensing terminal 35B.

The plate-like connecting members 52 are electrically conductive, and are made of any one of Al, Au and Cu, for example. The plate-like connecting members 52 may be formed by bending a metal plate. As shown in FIGS. 19, 21 and 22, the plate-like connecting members 52 include a plurality of first leads 521 and a plurality of second leads 522. The semiconductor device B1 may include, instead of the plate-like connecting members 52, the cord-like connecting members 51 such as bonding wires.

As shown in FIGS. 19, 21 and 22, the first leads 521 connect the respective switching elements 20A to the conductive member 11B. More specifically, each first lead 521 is bonded at one end to the first electrode 211 (source electrode) of the corresponding switching element 20A, and the other end to the surface of the conductive member 11B.

As shown in FIGS. 19, 21 and 22, the second leads 522 connect the respective switching elements 20B to the input terminal 32. More specifically, each second lead 522 is bonded at one end to the first electrode 211 (source electrode) of the corresponding switching element 20B, and the other end to one of the extended portions 321b of the pad portion 321 of the input terminal 32. The second leads 522 may be bonded with Ag paste or solder, for example. In this embodiment, each second lead 522 is bent in the z direction.

As shown in FIGS. 22 and 23, the sealing resin 60 covers the insulating substrate 10 (except for the reverse surface 102), the conductive members 11, the switching elements 20, the cord-like connecting members 51 and the plate-like connecting members 52. The sealing resin 60 is made of an epoxy resin, for example. As shown in FIGS. 18, 20, 21 and 23 to 26, the sealing resin 60 has a resin obverse surface 61, a resin reverse surface 62, and a plurality of resin side surfaces 63.

The resin obverse surface 61 and the resin reverse surface 62 are spaced apart and face away from each other in the z direction. The resin obverse surface 61 faces in the z2, and the resin reverse surface 62 faces in the z1 direction. In the bottom view shown in FIG. 24, the resin reverse surface 62 has the shape of a frame surrounding the reverse surface 102 of the insulating substrate 10. Each resin side surface 63 is connected to and sandwiched between the resin obverse surface 61 and the resin reverse surface 62. The resin side surfaces 63 include a pair of resin side surfaces 631 and 632 spaced apart in the x direction, and a pair of resin side surfaces 633 and 634 spaced apart in the y direction. The resin side surface 631 faces in the x2 direction, and the resin side surface 632 faces in the x1 direction. The resin side surface 633 faces in the y2 direction, and the resin side surface 634 faces in the y1 direction.

As shown in FIGS. 18, 23 and 24, the sealing resin 60 includes a plurality of recesses 65 each of which is recessed from the resin reverse surface 62 in the z direction. Each recess 65 extends in the y direction. In plan view, each recess 65 is continuous across the resin reverse surface 62, from one edge in the y1 direction to the other edge in the y2 direction. The recesses 65 include three recesses located at one side and another three recesses located at the other side across the reverse surface 102 of the insulating substrate 10 in the x direction in plan view. The recesses 65 of the sealing resin 60 may be omitted.

Next, advantageous effects of the semiconductor device B1 according to the present disclosure will be described.

The semiconductor device B1 has the roughened area 93A on the surface of the conductive member 11A. The roughened area 93A is covered by the sealing resin 60. That is, the semiconductor device B1 has a package structure A1 formed by the conductive member 11A as a metal member 91 and the sealing resin 60 as a resin member 92. Thus, the strength of adhesion between the conductive member 11A and the sealing resin 60 is increased. The semiconductor device B1 is therefore more resistant to peeling of the sealing resin 60 and capable of more reliably prevent the switching elements 20 form being exposed to ambient air.

The semiconductor device B1 has the roughened area 93b on the surface of the conductive member 11B. The roughened area 93B is covered by the sealing resin 60. That is, the semiconductor device B1 has a package structure A1 formed by the conductive member 11B as a metal member 91 and the sealing resin 60 as a resin member 92. Thus, the strength of adhesion between the conductive member 11B and the sealing resin 60 is increased. The semiconductor device B1 is therefore more resistant to peeling of the sealing resin 60 and capable of more reliably prevent the switching elements 20 form being exposed to ambient air.

The semiconductor device B1 has the roughened area 93C on the surface of the input terminal 32. The roughened area 93C is covered by the sealing resin 60. That is, the semiconductor device B1 has a package structure A1 formed by the input terminal 32 as a metal member 91 and the sealing resin 60 as a resin member 92. Thus, the strength of adhesion between the input terminal 32 and the sealing resin 60 is increased. The semiconductor device B1 is therefore more resistant to peeling of the sealing resin 60 and capable of more reliably prevent the switching elements 20 form being exposed to ambient air.

The semiconductor device B1 has the roughened area 93D on the surface of the output terminal 33. The roughened area 93D is covered by the sealing resin 60. That is, the semiconductor device B1 has a package structure A1 that is formed by the output terminal 33 as a metal member 91 and the sealing resin 60 as a resin member 92. Thus, the strength of adhesion between the output terminal 33 and the sealing resin 60 is increased. The semiconductor device B1 is therefore more resistant to peeling of the sealing resin 60 and capable of more reliably prevent the switching elements 20 form being exposed to ambient air.

The semiconductor device B1 has the roughened areas 93E on the respective surfaces of the side terminals 37A and 37B. The roughened areas 93E are covered by the sealing resin 60. That is, the semiconductor device B1 has a package structure A1 that is formed by the side terminals 37A and 37B as metal members 91 and the sealing resin 60 as ae resin member 92. Thus, the strength of adhesion between each of the side terminals 37A and 37B and the sealing resin 60 is increased. The semiconductor device B1 is therefore more resistant to peeling of the sealing resin 60 and capable of more reliably prevent the switching elements 20 form being exposed to ambient air.

The semiconductor device B1 has the roughened areas 93A to 93E overlapping with the edges of the sealing resin 60. The edge portions of the sealing resin 60 are more prone to peeling from the metal members, such as the input terminals 31 and 32 the output terminal 33. Thus, forming the roughened areas 93A to 93E at the portions overlapping with the edge regions of the sealing resin 60 is effective to improve the adhesion strength of the portions susceptible to heat stress. The semiconductor device B1 can therefore improve the adhesion strength of the sealing resin 60 and also improve the efficiency of producing the semiconductor device B1. In particular, forming the roughened areas (the roughened areas 93C and 93D, for instance) on the input terminals 31 and 32 the output terminal 33, which are susceptible to heat stress, is particularly effective to prevent peeling of the sealing resin 60.

This embodiment is directed to the semiconductor device B1 having the roughened areas 93A to 93E of the same configuration as the roughened area 93 of the package structure A1, which means that the semiconductor device B1 has structures identical to the package structure A1. However, the present disclosure is not limited to this. For example, at least one of the roughened areas 93A to 93E may be replaced by a roughened area having the same configuration as the roughened area 93' of the package structure A2 or the roughened area rea 93" of the package structure A3. In other word, the semiconductor device B1 may have a package structure A2 or a package structure A3.

Next, variations of the semiconductor device B1 of the present disclosure will be described with reference to FIGS. 31 and 32.

Figure 31:
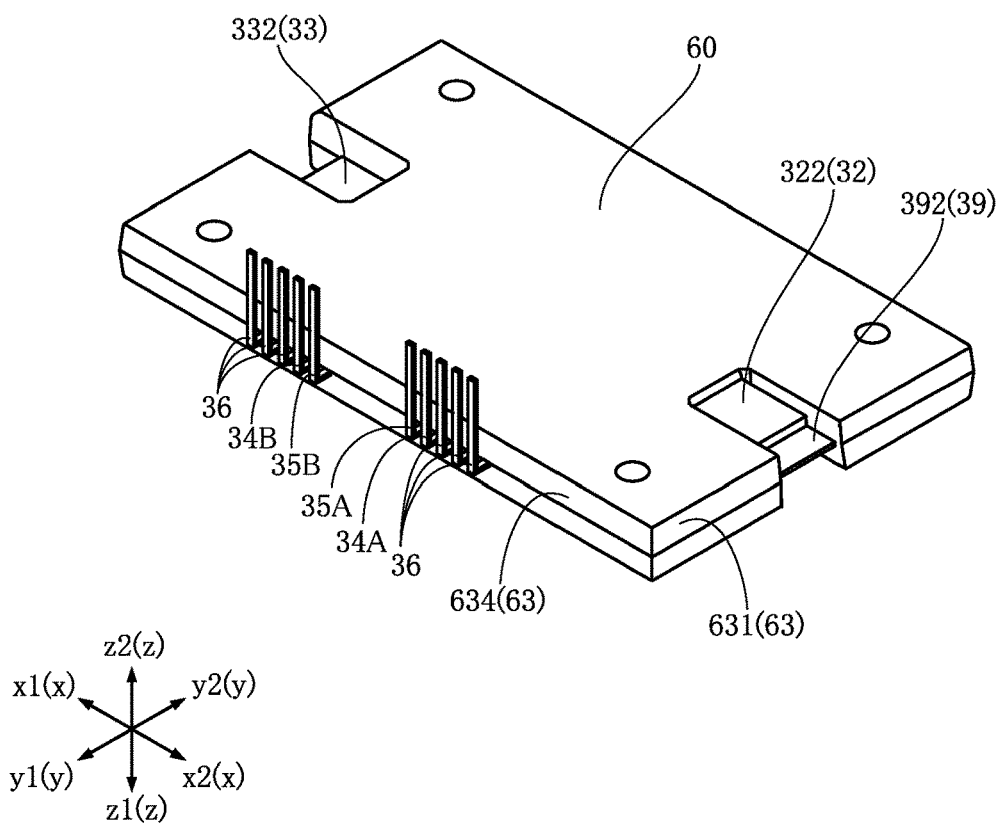
FIG. 31 is a perspective view of a semiconductor device according to a variation.

FIG. 31 shows a semiconductor device B2 having a sealing resin 60 of a different shape than the sealing resin 60 of the semiconductor device B1. Other than that, the semiconductor device B2 has the same configuration as the semiconductor device B1. FIG. 31 is a perspective view of the semiconductor device B2. Although not shown in FIG. 31, the semiconductor device B2 has the roughened area 93 at the substantially same relative position as the roughened area 93 in the semiconductor device B1.

In this embodiment, the opposite ends of the sealing resin 60 in the y direction have portions extended in in the x direction. These extended portions of the sealing resin 60 in the x2 direction cover portions of the input terminals 31 and 32 and of the insulating member 39. Also, the extended portions of the sealing resin 60 in the x1 direction cover portions of the output terminal 33.

The semiconductor device B2 having at least one of the package structures A1 to A3 is enabled to prevent peeling of the resin member 92, which in the sealing resin 60 of this variation.

As compared to the semiconductor device B1, the semiconductor device B2 has a larger sealing resin 60, which thus covers greater poisons of the input terminals 31 and 32, the output terminal 33 and the insulating member 39. This enables the semiconductor device B2 to protect the input terminals 31 and 32, the output terminal 33 and the insulating member 39 against deterioration and bends, more reliably than the semiconductor device B1. The semiconductor device B2 may be modified as to the size and arrangement of each roughened area 93.

Figure 32:
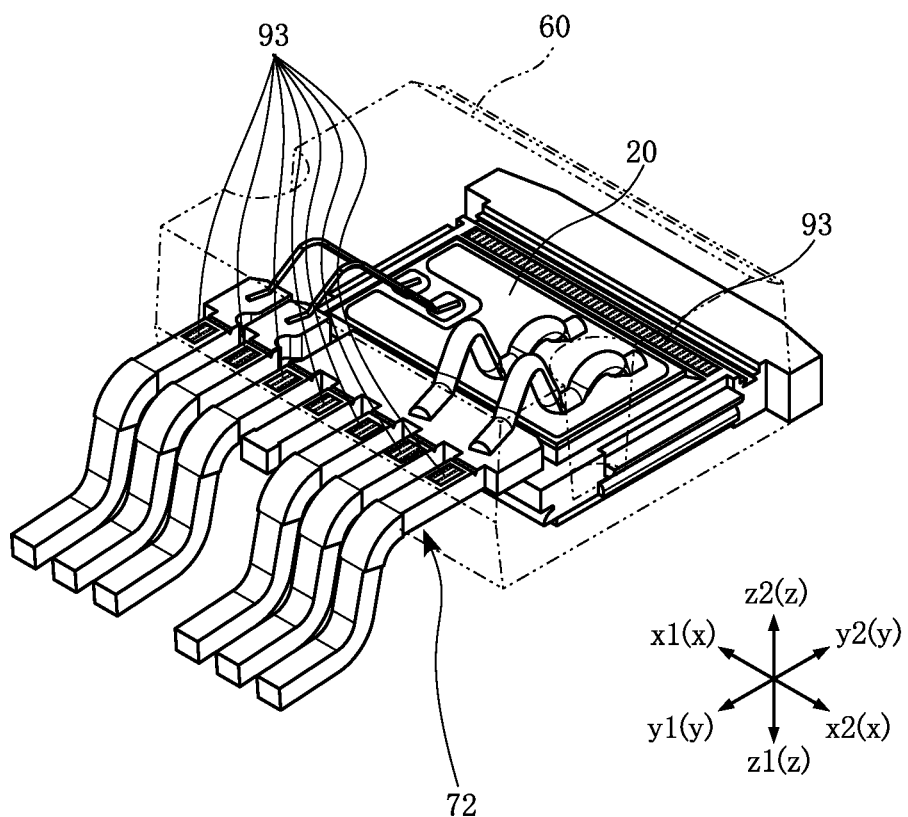
FIG. 32 is a perspective view of a semiconductor device according to another variation.

FIG. 32 shows a semiconductor device B3, which unlike the semiconductor device B1 is a discreate semiconductor having one switching element 20. In one alternative, the switching element 20 may be replaced by a semiconductor element, such as a diode or IC.

The semiconductor device B3 has a so-called lead frame. The semiconductor device B3 includes a lead frame 72. The lead frame 72 may be made of, but not limited to, Cu or a Cu alloy. In addition, the lead frame 72 is not limited to the shape shown in FIG. 32. The switching element 20 is mounted on the lead frame 72. The sealing resin 60 coves the switching element 20 and portions of the lead frame 72.

As shown in FIG. 32, the semiconductor device B3 has roughened areas 93 formed on the surface of the lead frame 72 at locations in contact with the sealing resin 60. That is, the semiconductor device B3 has a package structure A1 that is formed by the lead frame 72 as the metal member 91 and the sealing resin 60 as the resin member 92.

The semiconductor device B3 having at least one of the package structures A1 to A3 is enabled to prevent peeling of the resin member 92, which is the sealing resin 60 of this variation.

Although the semiconductor devices B2 and B3 having a package structure A1 have been described, this is not a limitation. For example, the semiconductor devices B2 and B3 may have a roughened area 93' or roughened area 93" instead of the roughened area 93. In such an example, the semiconductor devices B2 and B3 will have a package structure A2 or A3 instead of the package structure A1. In addition, each of the semiconductor devices B1, B2 and B3 may have the roughened areas 93, 93' and 93" in combination, instead of only one type roughened areas.

The package structure, the semiconductor device and a method of forming the package structure according to the present disclosure are not limited to the embodiments described above. Various design changes may be made to the specific details of components of the package structure and the semiconductor device as well as to the processing steps of the method of forming the package structure.

The invention claimed is:
1. A package structure comprising:
a metal member having an obverse surface facing one side in a first direction; and
a resin member disposed in contact with at least a portion of the obverse surface,
wherein the obverse surface has a roughened area, the roughened area includes a plurality of first trenches recessed from the obverse surface, each of the first trenches having a surface with a greater roughness than the obverse surface, the plurality of first trenches extend in a second direction perpendicular to the first direction and are next to each other in a third direction perpendicular to the first direction and the second direction, the plurality of first trenches are filled with the resin member, the roughened area further includes a plurality of second trenches each of which has a surface with a greater roughness than the obverse surface, the plurality of second trenches extend in the third direction and are next to each other in the second direction, as viewed in the first direction, each of the first trenches intersects each of the plurality of second trenches, the roughened area has an intersection bottom surface and a non-intersection bottom surface, as viewed in the first direction, the intersection bottom surface overlaps with one of the plurality of first trenches and one of the plurality of second trenches, as viewed in the first direction, the non-intersection bottom surface overlaps with only one of the plurality of first trenches or only one of the plurality of second trenches are located, and the intersection bottom surface is more distant in the first direction from the obverse surface than the non-intersection bottom surface.

2. The package structure according to claim 1, wherein as viewed in the first direction, each of the plurality of first trenches is continuous from one edge of the roughened area in the second direction to another edge of the roughened area in the second direction.

3. The package structure according to claim 2, wherein as viewed in the first direction, each of the plurality of first trenches extends linearly in the second direction.

4. The package structure according to claim 3, wherein the roughened area of the obverse surface includes a ridge between two of the plurality of first trenches adjacent to each other in the third direction, and as viewed in the first direction, the ridge is continuous from one edge of the roughened area in the second direction to another edge of the roughened area in the second direction.

5. The package structure according to claim 1, wherein as viewed in the first direction, each of the plurality of second trenches extends linearly.

6. The package structure according to claim 5, wherein a distance between two adjacent first trenches out of the plurality of first trenches is substantially equal to a distance between two adjacent second trenches out of the plurality of second trenches.

7. The package structure according to claim 1, wherein each of the plurality of first trenches has a profile with a curved edge in a section taken perpendicular to the second direction.

8. The package structure according to claim 1, wherein each of the first trenches has surface asperities finer than undulations formed by the plurality of first trenches themselves on the roughened area.

9. The package structure according to claim 1, wherein the plurality of first trenches has a surface layer comprising an oxide layer composed of an oxide of a substance of the metal member.

10. The package structure according to claim 1, wherein the plurality of first trenches are arranged at a predetermined pitch.

11. The package structure according to claim 1, wherein each of the plurality of first trenches has a width of 10 to 200 μm.

12. The package structure according to claim 1, wherein each of the plurality of first trenches has a depth and a width such that a ratio of the depth to the width is within a range of 0.2 to 1.2.

13. A semiconductor device comprising a package structure, the package structure comprising:
a metal member having an obverse surface facing one side in a first direction; and
a resin member disposed in contact with at least a portion of the obverse surface,
wherein the obverse surface has a roughened area,
the roughened area includes a plurality of first trenches recessed from the obverse surface, each of the first trenches having a surface with a greater roughness than the obverse surface,
the plurality of first trenches extend in a second direction perpendicular to the first direction and are next to each other in a third direction perpendicular to the first direction and the second direction, and
the plurality of first trenches are filled with the resin member,
the semiconductor device comprises:
a first switching element;
a first terminal and a second terminal each of which is electrically connected to the first switching element;
an insulating substrate having a substrate obverse surface facing the side in the first direction; and
a first conductive member disposed on the substrate obverse surface and electrically bonded to the first switching element,
the first terminal is electrically bonded to the first conductive member,
the resin member covers the first switching element, a portion of the first terminal and a portion of the second terminal, and
the first terminal includes the roughened area.

14. The semiconductor device according to claim 13, wherein the first terminal has a first pad portion covered with the resin member and a first terminal portion exposed from the resin member, and
the roughened area is formed at an edge of the first pad portion connected to the first terminal portion.

15. The semiconductor device according to claim 14, wherein the second terminal includes the roughened area.

16. The semiconductor device according to claim 15, wherein the second terminal has a second pad portion covered with the resin member and a second terminal portion exposed from the resin member, and
the roughened area of the second terminal is formed at an edge of the second pad portion connected to the second terminal portion.

17. The semiconductor device according to claim 13, wherein the first conductive member includes the roughened area on at least a part of a surface bonded to the first switching element.

18. The semiconductor device according to claim 13, further comprising:
a second conductive member disposed on the substrate obverse surface and spaced apart from the first conductive member;

a second switching element that is different from the first switching element and electrically bonded to the second conductive member; and a third terminal electrically bonded to the second conductive member, wherein the third terminal has a third pad portion covered with the resin member and a third terminal portion exposed from the resin member, and the second switching element is electrically connected to the first conductive member.

19. The semiconductor device according to claim 18, wherein the second conductive member includes the roughened area on at least a part of a surface on which the second switching element is bonded.

20. The semiconductor device according to claim 18, further comprising an insulating member disposed between the second terminal portion and the third terminal portion in the first direction, wherein as viewed in the first direction, a portion of the insulating member overlaps with the second terminal portion and the third terminal portion.

\* \* \* \* \*